United States Patent
Bok et al.

(10) Patent No.: US 12,230,739 B2
(45) Date of Patent: Feb. 18, 2025

(54) DISPLAY DEVICE

(71) Applicant: SAMSUNG DISPLAY CO., LTD., Yongin-si (KR)

(72) Inventors: Seung Lyong Bok, Yongin-si (KR); Hyun Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 481 days.

(21) Appl. No.: 17/774,697

(22) PCT Filed: Sep. 8, 2020

(86) PCT No.: PCT/KR2020/012124
§ 371 (c)(1),
(2) Date: May 5, 2022

(87) PCT Pub. No.: WO2021/091065
PCT Pub. Date: May 14, 2021

(65) Prior Publication Data
US 2022/0393070 A1 Dec. 8, 2022

(30) Foreign Application Priority Data
Nov. 8, 2019 (KR) .......... 10-2019-0142706

(51) Int. Cl.
H01L 33/38 (2010.01)
G06F 3/044 (2006.01)
(Continued)

(52) U.S. Cl.
CPC .......... H01L 33/387 (2013.01); G06F 3/0443 (2019.05); H01L 27/156 (2013.01); H01L 33/62 (2013.01); G06F 2203/04107 (2013.01)

(58) Field of Classification Search
CPC ..... H01L 33/387; H01L 27/156; H01L 33/62; H01L 33/20; H01L 33/44; H01L 25/0753;
(Continued)

(56) References Cited

U.S. PATENT DOCUMENTS 7,663,607 B2  2/2010 Hotelling et al.
8,390,582 B2  3/2013 Hotelling et al.
(Continued)

FOREIGN PATENT DOCUMENTS

KR  10-1244926  3/2013
KR  10-1490758  2/2015
(Continued)

OTHER PUBLICATIONS

International Search Report, with English translation, corresponding to International Application No. PCT/KR2020/012124 dated Dec. 9, 2020.
(Continued)

Primary Examiner — Temesghen Ghebretinsae
Assistant Examiner — Ivelisse Martinez Quiles
(74) Attorney, Agent, or Firm — KILE PARK REED & HOUTTEMAN PLLC

(57) ABSTRACT

A display device includes pixel areas; and a pixel disposed in each of the pixel areas. The pixel includes a first electrode and a second electrode disposed on a substrate and disposed on a same layer, a light emitting element disposed on the first electrode and the second electrode, a third electrode electrically connecting the first electrode to a first end of the light emitting element, a fourth electrode electrically connecting the second electrode to a second end of the light emitting element, and an electrode pattern and the electrode pattern and one of the third electrode and the fourth electrode being disposed on a same layer.

22 Claims, 30 Drawing Sheets

(51) Int. Cl.
*H01L 27/15* (2006.01)
*H01L 33/62* (2010.01)

(58) Field of Classification Search
CPC ..... H01L 27/12; H01L 27/124; G06F 3/0443; G06F 2203/04107; G06F 3/0446; G06F 3/0412; G06F 3/044; G06F 3/041
See application file for complete search history.

(56) References Cited

U.S. PATENT DOCUMENTS

| | | | |
|---|---|---|---|
| 8,860,685 | B2 | 10/2014 | Takeuchi et al. |
| 9,112,112 | B2 | 8/2015 | Do et al. |
| 9,229,589 | B2 | 1/2016 | Lee et al. |
| 9,773,761 | B2 | 9/2017 | Do |
| 9,927,898 | B2 | 3/2018 | Bok et al. |
| 10,042,495 | B2 | 8/2018 | Yang et al. |
| 10,185,430 | B2 | 1/2019 | Zhu et al. |
| 10,338,712 | B2 | 7/2019 | Bok et al. |
| 10,372,249 | B2 | 8/2019 | Liu et al. |
| 10,546,902 | B2 | 1/2020 | Lee et al. |
| 10,614,761 | B2 | 4/2020 | Lee et al. |
| 10,665,661 | B2 | 5/2020 | Park et al. |
| 10,769,990 | B2 | 9/2020 | Cho et al. |
| 10,818,647 | B2 | 10/2020 | Kim et al. |
| 10,977,471 | B2 | 4/2021 | Yoon et al. |
| 2017/0269749 | A1* | 9/2017 | Bok ................ G06F 3/0412 |
| 2020/0012374 | A1* | 1/2020 | Nakanishi ......... H10K 59/40 |
| 2021/0242380 | A1 | 8/2021 | Kim et al. |

FOREIGN PATENT DOCUMENTS

| | | |
|---|---|---|
| KR | 10-2017-0040424 | 4/2017 |
| KR | 10-2017-0109718 | 10/2017 |
| KR | 10-2018-0007025 | 1/2018 |
| KR | 10-2018-0051692 | 5/2018 |
| KR | 10-2018-0072909 | 7/2018 |
| KR | 10-2018-0121736 | 11/2018 |
| KR | 10-2019-0042788 | 4/2019 |
| KR | 10-2019-0095638 | 8/2019 |
| KR | 10-2019-0096475 | 8/2019 |
| KR | 10-2019-0098305 | 8/2019 |
| KR | 10-2019-0124359 | 11/2019 |

OTHER PUBLICATIONS

Written Opinion, with English translation, corresponding to International Application No. PCT/KR2020/012124, dated Dec. 9, 2020.

\* cited by examiner

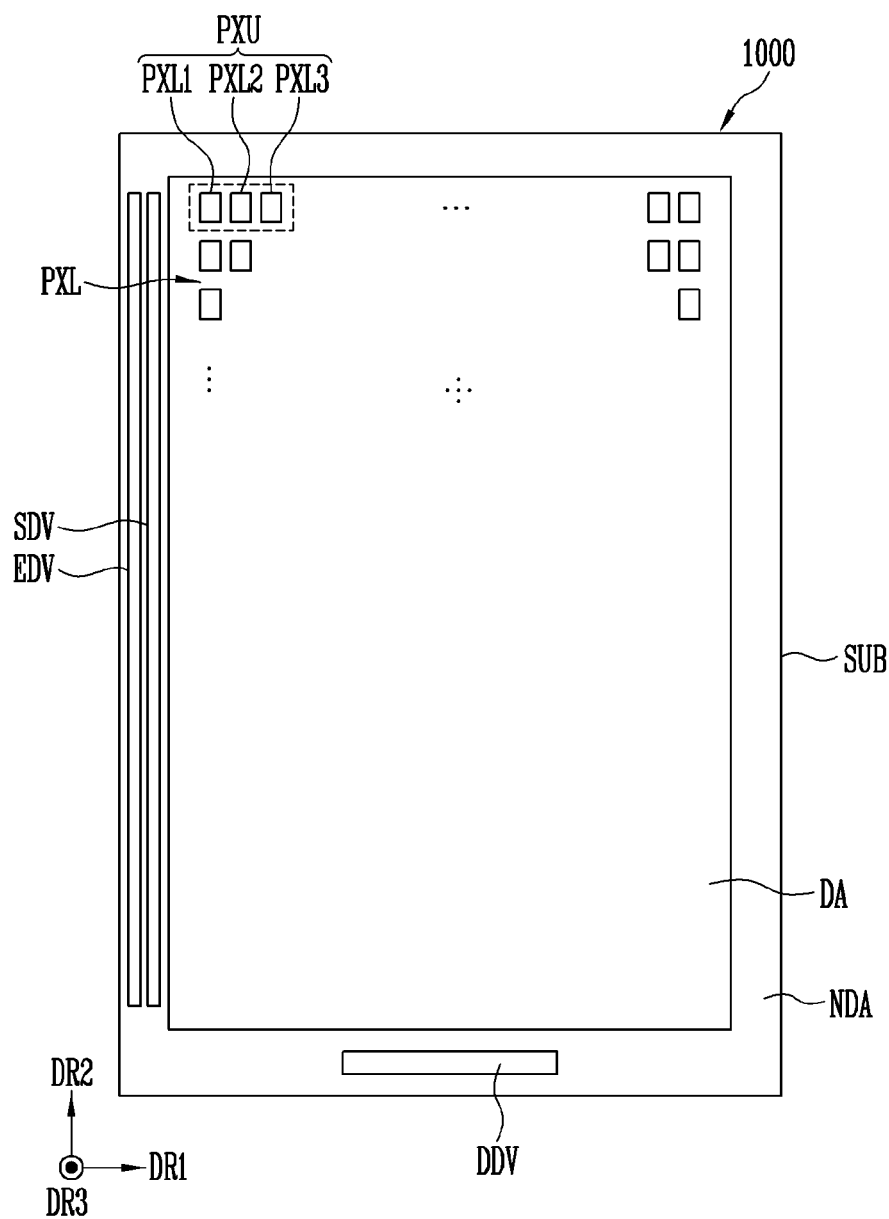

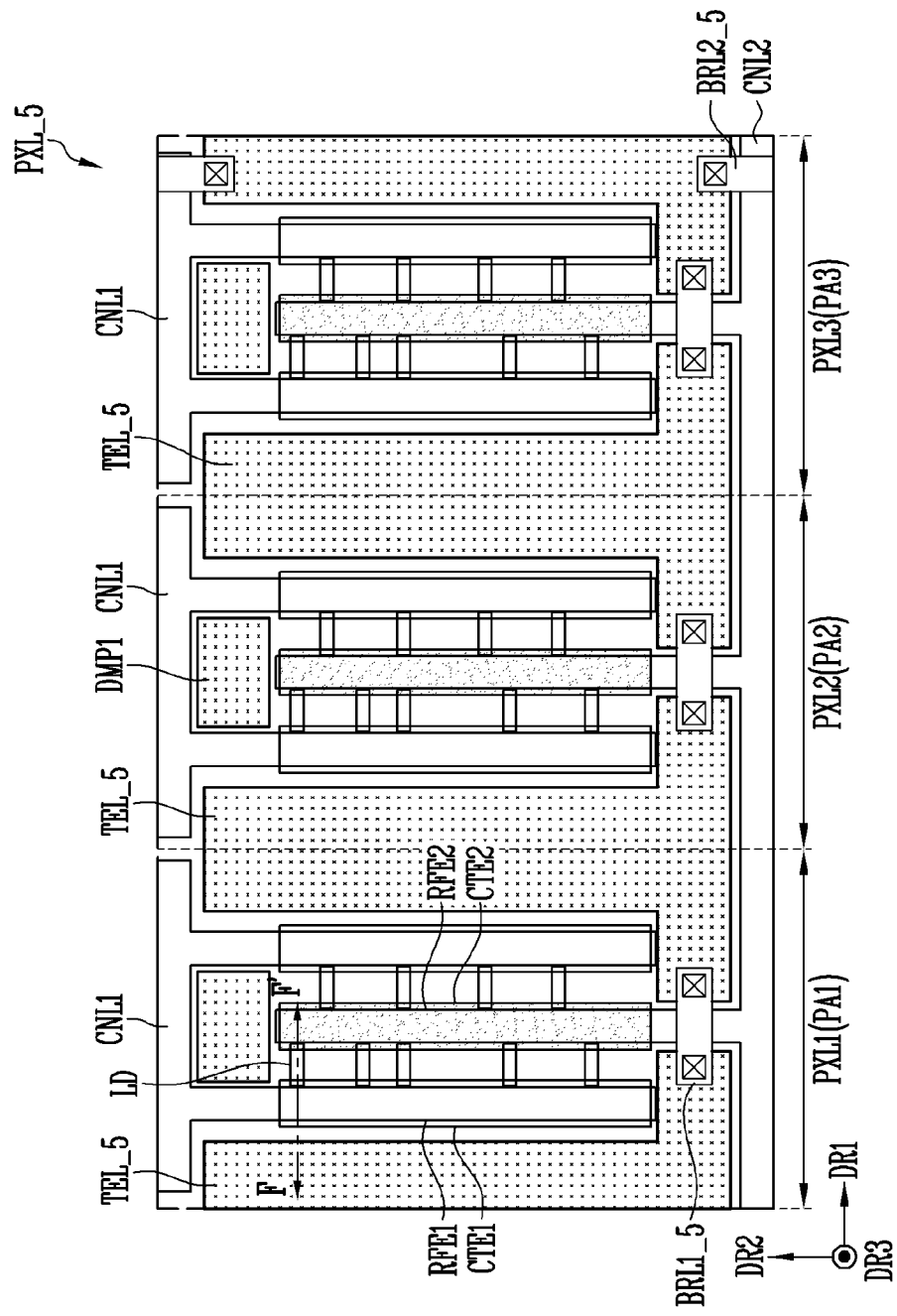

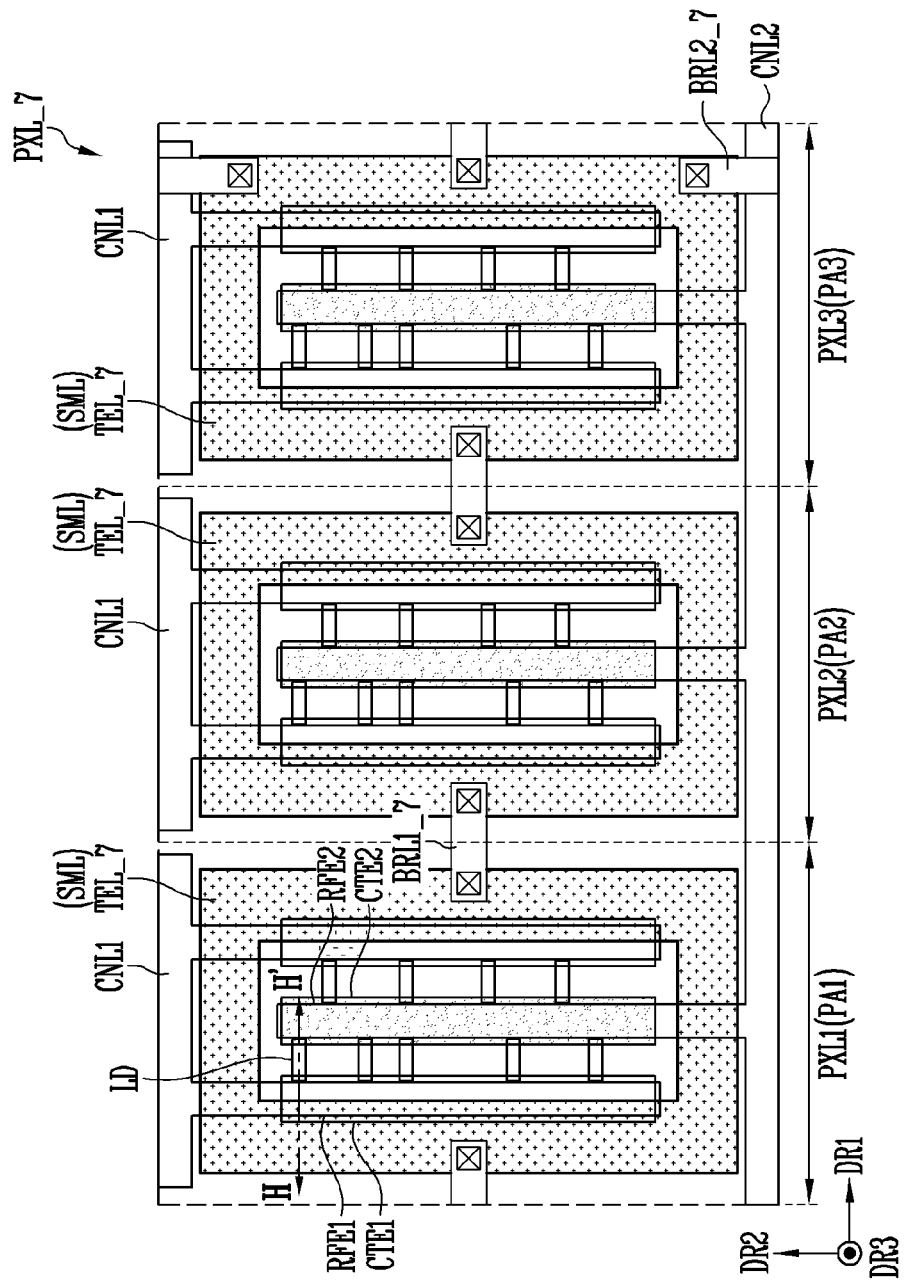

DISPLAY DEVICE

CROSS-REFERENCE TO RELATED APPLICATION(S)

This application is a national entry of International Application No. PCT/KR2020/012124, filed on Sep. 8, 2020, which claims under 35 U.S.C. § 119(a) and 365(b) priority to and benefits of Korean Patent Application No. 10-2019-0142706, filed on Nov. 8, 2019 in the Korean Intellectual Property Office, the entire contents of which are incorporated herein by reference.

1. TECHNICAL FIELD

Various embodiments relate to a display device, and, to a display device including a light emitting element.

2. DESCRIPTION OF THE RELATED ART

With an increase in interest in an information display and an increase in demand to use portable information media, demand for display devices is markedly increased, and commercialization thereof is in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In case that a sensing electrode layer is formed on a panel of a display device to form a sensing electrode of a touch sensor, a separate process for forming the sensing electrode layer may be required, and the manufacturing cost of the display device may increase.

Various embodiments of the are directed to a display device that forms an electrode pattern disposed on a same layer as internal lines of each pixel and uses the electrode pattern as a sensing electrode of a touch sensor.

The effects of the disclosure are not limited to the above-stated effects, and those skilled in the art will clearly understand other effects from the accompanying claims.

A display device may include pixel areas; and a pixel disposed in each of the pixel areas, and the pixel may include a first electrode and a second electrode disposed on a substrate and disposed on a same layer; a light emitting element disposed on the first electrode and the second electrode; a third electrode electrically connecting the first electrode to a first end of the light emitting element; a fourth electrode electrically connecting the second electrode to a second end of the light emitting element; and an electrode pattern, the electrode pattern and one of the third electrode and the fourth electrode being disposed on a same layer.

The electrode pattern and the third electrode may be disposed on a same layer and the electrode pattern may be electrically insulated from the third electrode.

The electrode pattern and the fourth electrode may be disposed on a same layer, the electrode pattern may be electrically insulated from the fourth electrode, and the electrode pattern may overlap at least a portion of the third electrode in a plan view.

The display device may further include an input sensing controller electrically connected to the electrode pattern, the electrode pattern may be an input sensing electrode, and the input sensing controller may sense an input from an external device based on a signal provided from the electrode pattern.

The display device may further include a first insulating layer overlapping at least a portion of the first electrode and the second electrode in a plan view, the first insulating layer being disposed between the light emitting element and the substrate, the first insulating layer may include a first opening exposing at least a portion of the first electrode and a second opening exposing at least a portion of the second electrode, and the third electrode may electrically contact the first electrode through the first opening, and the fourth electrode may electrically contact the second electrode through the second opening.

The display device may further include a second insulating layer overlapping the third electrode in a plan view, and the electrode pattern and the fourth electrode may be disposed on a same layer and the electrode pattern may be disposed on the second insulating layer.

The display device may further include a second insulating layer overlapping the third electrode in a plan view, the electrode pattern and the third electrode may be disposed on a same layer, and the electrode pattern may be disposed between the first insulating layer and the second insulating layer.

The electrode pattern may include a first electrode pattern and a second electrode pattern spaced apart from each other.

The display device may further include a connection pattern electrically connecting the first electrode pattern to the second electrode pattern, the connection pattern and one of the third electrode and the fourth electrode may be disposed on a same layer, and the connection pattern may be disposed on a layer different from the first electrode pattern and the second electrode pattern.

The display device may further include a bank disposed on the substrate along a boundary of the pixel areas, and the connection pattern may be disposed on the bank.

The display device may further include a bank disposed on the substrate along a boundary of the pixel areas, and the connection pattern may be disposed between the first insulating layer and the bank.

The display device may further include a second insulating layer overlapping the third electrode in a plan view, and the second insulating layer may include a first contactor and a second contactor overlapping the connection pattern in a plan view, and the electrode pattern may be electrically connected to the connection pattern through the first contactor and the second contactor.

The display device may further include a second insulating layer overlapping the third electrode and the fourth electrode in a plan view, the third electrode and the fourth electrode may be disposed on a same layer, and the electrode pattern may be disposed between the first insulating layer and the second insulating layer.

The display device may further include a bank disposed on the substrate along a boundary of the pixel areas, and the electrode pattern may be disposed between the bank and the second insulating layer.

The electrode pattern may be disposed in a window shape in a plan view.

A display device may include pixel areas; a pixel disposed in each of the pixel areas; and an input sensing controller, the pixel may include a first electrode and a second electrode disposed on a substrate and disposed on a same layer; a light emitting elements electrically connected to the first electrode and the second electrode; and a sensing electrode, the sensing electrode, the first electrode and the second electrode being disposed a the same layer, and the input sensing controller may be electrically connected to the sensing electrode to sense an input from an external device based on a signal provided from the sensing electrode.

The display device may further include a first insulating layer overlapping at least a portion of the first electrode and the second electrode in a plan view and disposed between the light emitting element and the substrate; a third electrode disposed on the first electrode and electrically contacting a first end of the light emitting element; and a fourth electrode disposed on the second electrode and electrically contacting a second end of the light emitting element, the first insulating layer may include a first opening exposing at least a portion of the first electrode and a second opening exposing at least a portion of the second electrode, and the third electrode may electrically contact the first electrode through the first opening, and the fourth electrode may electrically contact the second electrode through the second opening.

The sensing electrode may include metal having a reflectivity, and the sensing electrode may reflect light incident from an outside and emit the light to the outside.

The display device may further include a dummy electrode, the dummy electrode, the first electrode and the second electrode being disposed on a same layer, and the dummy electrode may be electrically disconnected from the sensing electrode.

A display device may include pixel areas; a pixel disposed in each of the pixel areas; and an input sensing controller, the pixel may include a first electrode and a second electrode disposed on a substrate and disposed on a same layer; a light emitting element disposed on the first electrode and the second electrode; a third electrode electrically connecting the first electrode to a first end of the light emitting element; a fourth electrode electrically connecting the second electrode to a second end of the light emitting element; a shield electrode disposed between the first electrode and the third electrode; and a sensing electrode, the sensing electrode and the shield electrode being disposed on a same layer, and the input sensing controller may be electrically connected to the sensing electrode to sense an input from an external device based on a signal provided from the sensing electrode.

The shield electrode and the sensing electrode may be spaced apart from each other, and be electrically disconnected from each other.

The display device may further include an insulating pattern disposed between the shield electrode and the third electrode, the shield electrode may be electrically disconnected from the third electrode by the insulating pattern, and the shield electrode may be integral with the sensing electrode.

Details of various embodiments are included in the detailed description and drawings.

A display device according to embodiments may include an electrode pattern that is used as a sensing electrode of a touch sensor on the same layer as any one of internal lines included in respective pixels.

Thus, in the display device according to the disclosure, a separate process for forming the sensing electrode of the touch sensor may be omitted, the manufacturing process of the display device may be simplified, and the manufacturing cost thereof may be reduced.

Furthermore, since the display device according to the disclosure does not include a separate sensing electrode layer for forming the sensing electrode of the touch sensor, it is possible to implement a thin display device.

The effects are not limited by the foregoing, and other various effects are included herein.

BRIEF DESCRIPTION OF THE DRAWINGS

The above and other aspects and features of the disclosure will become more apparent by describing in detail embodiments thereof with reference to the attached drawings, in which:

FIG. 2 is a schematic plan view schematically illustrating a display device in accordance with an embodiment.

FIG. 20 is a schematic plan view illustrating pixels in accordance with an embodiment.

FIG. 25 is a schematic plan view illustrating a display device in accordance with an embodiment.

DETAILED DESCRIPTION OF THE EMBODIMENTS

Figure 1A:
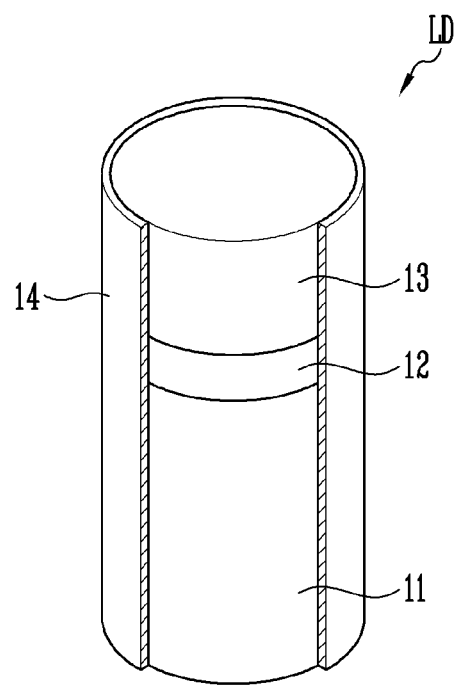
FIGS. 1A and 1B are schematic perspective views illustrating a light emitting element in accordance with an embodiment.

Advantages and features of the disclosure, and methods for achieving the same will be understood with reference to embodiments described in detail together with the accompanying drawings. The disclosure may, however, be embodied in many different forms and should not be construed as being limited to the embodiments set forth herein. Rather, these embodiments are provided so that this disclosure will be thorough and complete and will fully convey the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure.

Hereinafter, embodiments will be described in detail with reference to the accompanying drawings. In the drawings, same or similar reference numerals are used to designate the same or similar elements.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
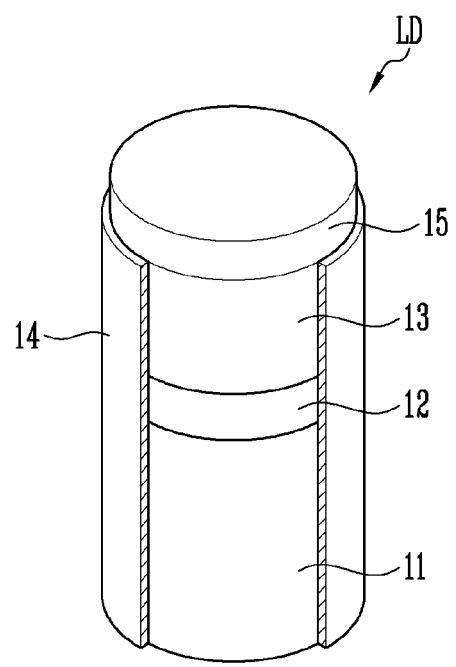

FIGS. 1A and 1B are perspective views illustrating a light emitting element in accordance with an embodiment.

Referring to FIGS. 1A and 1B, the light emitting element LD in accordance with an embodiment may include a first semiconductor layer 11, a second semiconductor layer 13, and an active layer 12 interposed between the first and second semiconductor layers 11 and 13. For example, the light emitting element LD may be implemented as a stack formed by successively stacking the first semiconductor layer 11, the active layer 12, and the second semiconductor layer 13 each other.

In an embodiment, the light emitting element LD may be provided in the form of a rod extending in one direction or a direction. If the direction in which the light emitting element LD extends is defined as the longitudinal direction, the light emitting element LD may have a first end and a second end in the longitudinal direction.

In an embodiment, one of the first and second semiconductor layers 11 and 13 may be disposed on the first end of the light emitting element, and the other of the first and second semiconductor layers 11 and 13 may be disposed on the second end of the light emitting element.

In an embodiment, the light emitting element LD may be provided in the form of a rod. Here, the term "rod type" embraces a rod-like shape and a bar-like shape such as a cylindrical shape and a prismatic shape extending in the longitudinal direction (for example, to have an aspect ratio greater than 1). For example, the length of the light emitting element LD may be greater than the diameter thereof. However, the disclosure is not limited thereto. For instance, the light emitting element LD may be the light emitting element of a core-shell structure. It is to be understood that the shapes disclosed herein may include shapes substantially identical or similar to the shapes.

The light emitting element LD may be fabricated to have a diameter and/or length corresponding to, for example, a micro-scale or nano-scale size. For example, the diameter of the light emitting element LD may be equal to or less than about 600 nm, and the length of the light emitting element LD may be equal to or less than about 4 μm. However, the size of the light emitting element LD is not limited thereto. For instance, the size of the light emitting element LD may be changed to meet requirements of the display device to which the light emitting element LD may be applied.

The first semiconductor layer 11 may include, for example, at least one n-type semiconductor layer. For instance, the first semiconductor layer 11 may include a semiconductor layer which may include any one semiconductor material of InAlGaN, GaN, AlGaN, InGaN, AlN, and InN, and is doped with a first dopant such as Si, Ge, or Sn. The material forming the first semiconductor layer 11 is not limited thereto, and the first semiconductor layer 11 may be formed of various other materials.

The active layer 12 may be formed on the first semiconductor layer 11 and have a single or multiple quantum well structure. The active layer 12 may emit light having a wavelength in a range of about 400 nm to about 900 nm. In an embodiment, a cladding layer (not shown) doped with a dopant may be formed on and/or under or below the active layer 12. For example, the cladding layer may be formed of an AlGaN layer or an InAlGaN layer. In an embodiment, material such as AlGaN or AlInGaN may also be used to form the active layer 12, and various other materials may be used to form the active layer 12.

If an electric field having a voltage or more is applied to the opposite ends of the light emitting element LD, the light emitting element LD emits light by coupling of electron-hole pairs in the active layer 12. Since the light emission of the light emitting element LD is controlled based on the foregoing principle, the light emitting element LD may be used as a light source of various light emitting devices as well as the pixel of the display device.

The second semiconductor layer 13 may be provided on the active layer 12 and include a semiconductor layer of a type different from that of the first semiconductor layer 11. For example, the second semiconductor layer 13 may include at least one p-type semiconductor layer. For instance, the second semiconductor layer 13 may include a semiconductor layer which may include any one semiconductor material of InAlGaN, GaN, AlGaN, InGaN, AlN, and InN, and is doped with a second dopant such as Mg. The material forming the second semiconductor layer 13 is not limited thereto, and the second semiconductor layer 13 may be formed of various other materials.

In an embodiment, the light emitting element LD may not only include the first semiconductor layer 11, the active layer 12, and the second semiconductor layer 13, but may also include a fluorescent layer, another active layer, another semiconductor layer, and/or an electrode layer provided on and/or under or below each layer.

In an embodiment, the light emitting element LD may further include at least one electrode layer disposed on one side or a side (for example, an upper surface) of the second semiconductor layer 13 or one side or a side (for example, a lower surface) of the first semiconductor layer 11. For example, as illustrated in FIG. 1B, the light emitting element LD may further include an electrode layer 15 disposed on one side or a side of the second semiconductor layer 13. The electrode layer 15 may be an ohmic electrode, but it is not limited thereto. Furthermore, the electrode layer 15 may include metal or a metal oxide. For example, chrome (Cr), titanium (Ti), aluminum (Al), gold (Au), nickel (Ni), ITO, and an oxide or alloy thereof may be used alone or in combination with each other. However, the disclosure is not limited to this. In an embodiment, the electrode layer 15 may be substantially transparent or translucent. Thereby, light generated from the light emitting element LD may be emitted to the outside of the light emitting element LD after passing through the electrode layer 15.

The light emitting element LD may further include an insulating film 14. However, in an embodiment, the insulating film 14 may be omitted, or may be provided to cover or overlap only some or a number of the first semiconductor layer 11, the active layer 12, and the second semiconductor layer 13. For example, the insulating film 14 may be provided on a portion of the light emitting element LD, other than the opposite ends thereof, so that the opposite ends of the light emitting element LD may be exposed.

For the sake of explanation, FIGS. 1A and 1B illustrate the insulating film 14 a portion of which has been removed. The entirety of the side surface of the light emitting element LD may be enclosed by the insulating film 14.

In an embodiment, the insulating film 14 may include a transparent insulating material. For example, the insulating film 14 may include at least one or more insulating materials among SiO2, Si3N4, Al2O3, and TiO2, but it is not limited thereto. In other words, various materials having insulation properties may be employed.

The insulating film 14 may prevent the active layer 12 from short-circuiting due to making contact with a conductive material except the first semiconductor layer 11 and the second semiconductor layer 13. Thanks to the insulating film 14, occurrence of a defect on the surface of the light emitting element LD may be minimized, whereby the lifetime and efficiency of the light emitting element may be improved. In the case where light emitting elements LD are disposed in close contact with each other, the insulating film 14 may prevent an undesired short-circuit from occurring between the light emitting elements LD.

The type, the structure, the shape, etc. of the light emitting element LD in accordance with an embodiment may be changed in various ways.

FIG. 2 is a schematic plan view schematically illustrating a display device in accordance with an embodiment.

Referring to FIGS. 1A to 2, the display device 1000 may include a substrate SUB, and pixels PXL provided on the substrate SUB. In detail, the display device 1000 may include a display area DA to display an image, and a non-display area NDA formed in areas other than the display area DA.

The display area DA may be an area in which the pixels PXL are provided. The non-display area NDA may be an area in which drivers for driving the pixels PXL and various lines (not illustrated) for coupling or connecting the pixels PXL to the drivers are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

In case that the display area DA may include areas, each area may also be provided in various shapes such as a closed polygon including linear sides, and a semicircle, a semi-ellipse or the like including sides formed of a curved line. Furthermore, the surface areas of the areas may be the same as or different from each other.

In an embodiment, there will be described an example in which the display area DA is provided with a single area having a rectangular shape including linear sides.

The non-display area NDA may be provided on at least one side or a side of the display area DA. In an embodiment, the non-display area NDA may enclose the display area DA.

The pixels PXL may be provided in the display area DA on the substrate SUB. Each of the pixels PXL may include at least one light emitting element LD to be driven in response to a corresponding scan signal and a corresponding data signal.

The pixels PXL each may include a light emitting element which emits white light and/or color light. Each pixel PXL may emit light having any one color among red, green, and blue, and it is not limited thereto. For example, each pixel PXL may emit light having any one color among cyan, magenta, yellow, and white.

In detail, the pixels PXL may include a first pixel PXL1 to emit light having a first color, a second pixel PXL2 to emit light having a second color different from the first color, and a third pixel PXL3 to emit light having a third color different from the first color and the second color. At least one first pixel PXL1, at least one second pixel PXL2, and at least one third pixel PXL3 that are disposed adjacent to each other may form one pixel unit PXU which may emit light having various colors.

In an embodiment, the first pixel PXL1 may be a red pixel which emits red light, a second pixel PXL2 may be a green pixel which emits green light, and a third pixel PXL3 may be a blue pixel which emits blue light. In an embodiment, the first pixel PXL1, the second pixel PXL2, and the third pixel PXL3 may include, as light sources, a light emitting element related to the first color, a light emitting element related to the second color, and a light emitting element related to the third color, so that the pixels may respectively emit light having the first color, light having the second color, and light having the third color. In an embodiment, the first pixel PXL1, the second pixel PXL2, and the third pixel PXL3 may respectively include light emitting elements having the same color, and photo conversion layers having different colors may be disposed on the respective light emitting elements so that the pixels may emit light having the first color, light having the second color, and light having the third color.

However, the colors, the types, and/or the number of pixels PXL that form each pixel unit PXU are not particularly limited.

The pixels PXL may be arranged or disposed in a first direction DR1 and a second direction DR2 intersecting the first direction DR1. The arrangement of the pixels PXL is not limited to a particular arrangement. In other words, the pixels may be arranged or disposed in various forms.

The drivers may provide signals to the pixels PXL through a line component (not illustrated) and thus control the operation of the pixels PXL. In FIG. 2, the line component is omitted for the sake of explanation.

The drivers may include a scan driver SDV to provide scan signals to the pixels PXL through scan lines, an emission driver EDV to provide emission control signals to the pixels PXL through emission control lines, a data driver DDV to provide data signals to the pixels PXL through data lines, and a timing controller (not illustrated). The timing controller may control the scan driver SDV, the emission driver EDV, and the data driver DDV. According to an embodiment, the display device 1000 may not include the emission driver EDV.

In an embodiment, each of the pixels PXL may be formed of an active pixel. However, the types, structures, and/or driving schemes of the pixels PXL applied to the disclosure are not particularly limited.

Figure 3A:
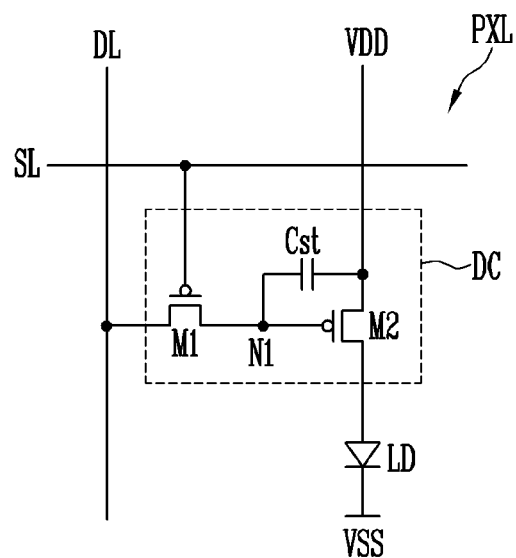
FIGS. 3A to 3C are schematic diagrams of an equivalent circuit of a pixel in accordance with an embodiment.
Figure 3B:
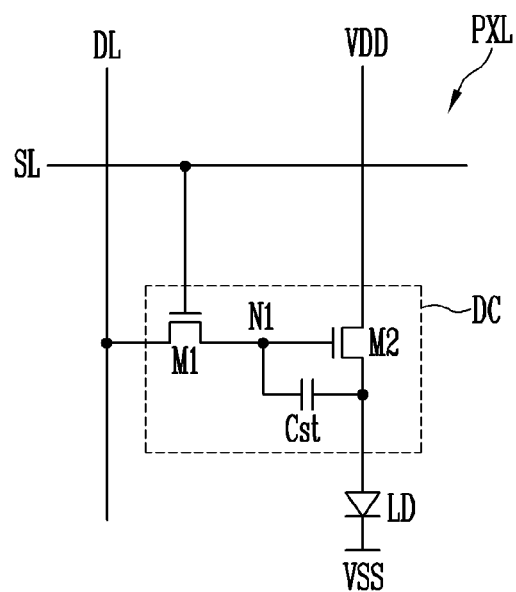
Figure 3C:
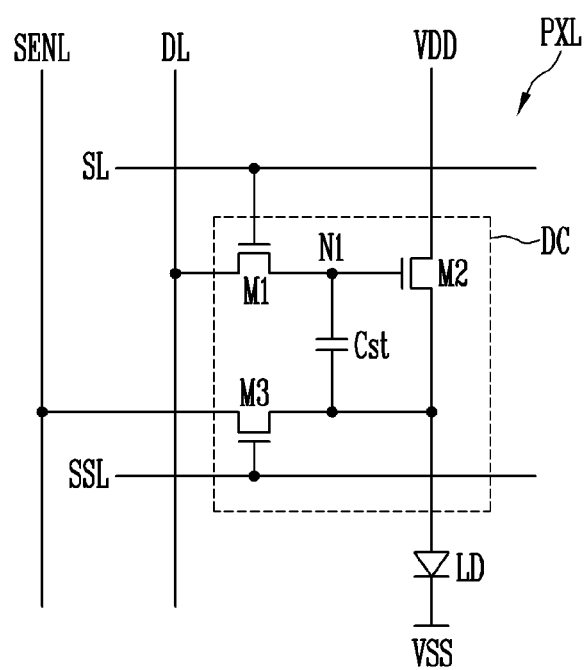

FIGS. 3A to 3C are schematic diagrams of an equivalent circuit of a pixel in accordance with an embodiment. For example, FIGS. 3A to 3C illustrate examples of a pixel that forms an active emission display panel.

Referring to FIG. 3A, each of the pixels PXL may include at least one light emitting element LD, and a pixel driving circuit DC which is connected to the light emitting element to drive the light emitting element LD.

A first electrode (for example, an anode electrode) of the light emitting element LD may be connected to a first driving power supply VDD via the pixel driving circuit DC. A second electrode (for example, a cathode electrode) of the light emitting element LD may be connected to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting element LD.

The light emitting element LD may emit light at a luminance corresponding to driving current which is controlled by the pixel driving circuit DC.

Although FIG. 3A illustrates an embodiment in which each of the pixels PXL may include only one light emitting element LD, the disclosure is not limited thereto. For example, each of the pixels PXL may include light emitting elements connected in parallel and/or series to each other.

In an embodiment, the pixel driving circuit DC may include a first transistor M1, a second transistor M2, and a storage capacitor Cst.

The first transistor (switching transistor) M1 may include a first electrode connected to a data line DL, and a second electrode connected to a first node N1. Here, the first electrode and the second electrode of the first transistor M1 may be different electrodes. For example, if the first electrode is a source electrode, the second electrode may be a drain electrode. A gate electrode of the first transistor M1 may be connected to a scan line SL.

In case that a scan signal having a voltage (for example, a gate-on voltage) capable of turning on the first transistor M1 is supplied from the scan line SL, the first transistor M1 may be turned on to electrically connect the data line DL with the first node N1. Here, a data signal of a corresponding frame is supplied to the data line DL, whereby the data signal may be transmitted to the first node N1. The data signal transmitted to the first node N1 may be stored in the storage capacitor Cst.

The second transistor (driving transistor) M2 may include a first electrode connected to the first driving power supply VDD, and a second electrode electrically connected to a first electrode (for example, an anode electrode) of the light emitting element LD. A gate electrode of the second transistor M2 may be connected to the first node N1. The second transistor M2 may control the amount of driving current to be supplied to the light emitting elements LD in response to the voltage of the first node N1.

The storage capacitor Cst may include a first electrode connected to the first driving power supply VDD, and a second electrode connected to the first node N1. The storage capacitor Cst may be charged with a voltage corresponding to a data signal supplied to the first node N1, and maintain the charged voltage until a data signal of a subsequent frame is supplied.

For the sake of explanation, FIG. 3A illustrates a driving circuit DC having a relatively simple structure including the first transistor M1 to transmit a data signal to the pixel PXL, the storage capacitor Cst to store the data signal, and the second transistor M2 to supply driving current corresponding to the data signal to the light emitting element LD.

However, the disclosure is not limited thereto, and the structure of the pixel circuit DC may be changed in various ways. For example, the driving circuit DC may further include at least one transistor such as a transistor to compensate for the threshold voltage of the second transistor M2, a transistor to initialize the first node N1, and/or a transistor to control an emission time of the light emitting element LD, or other circuit elements such as a boosting capacitor for boosting the voltage of the first node N1.

Furthermore, although in FIG. 3A the transistors, for example, the first and second transistors M1 and M2, included in the driving circuit DC have been illustrated as being formed of P-type transistors, the disclosure is not limited thereto. In other words, at least one of the first and second transistors M1 and M2 included in the driving circuit DC may be changed to an N-type transistor.

For example, referring to FIG. 3B, each of the first and second transistors M1 and M2 of the driving circuit DC may be formed of an N-type transistor. The configuration and operation of the driving circuit DC illustrated in FIG. 3B, other than a change in connection positions of some or a number of components due to a change in the type of transistor, may be similar to those of the driving circuit DC of FIG. 3A. Therefore, detailed descriptions pertaining to this will be omitted.

Referring to FIG. 3C, in an embodiment, each of the pixels PXL may further include a third transistor M3 (sensing transistor).

A gate electrode of the third transistor M3 may be connected to a sensing signal line SSL. A first electrode of the third transistor M3 may be connected to the sensing line SENL, and a second electrode thereof may be connected to the anode electrode of the light emitting element LD. The third transistor M3 may transmit a voltage value at the anode electrode of the light emitting element LD to the sensing line SENL in response to a sensing signal supplied to the sensing signal line SSL. The voltage value transmitted through the sensing line SENL may be provided to an external circuit (for example a timing controller), and the external circuit may compensate for each pixel PXL based on the provided voltage value.

Figure 4:
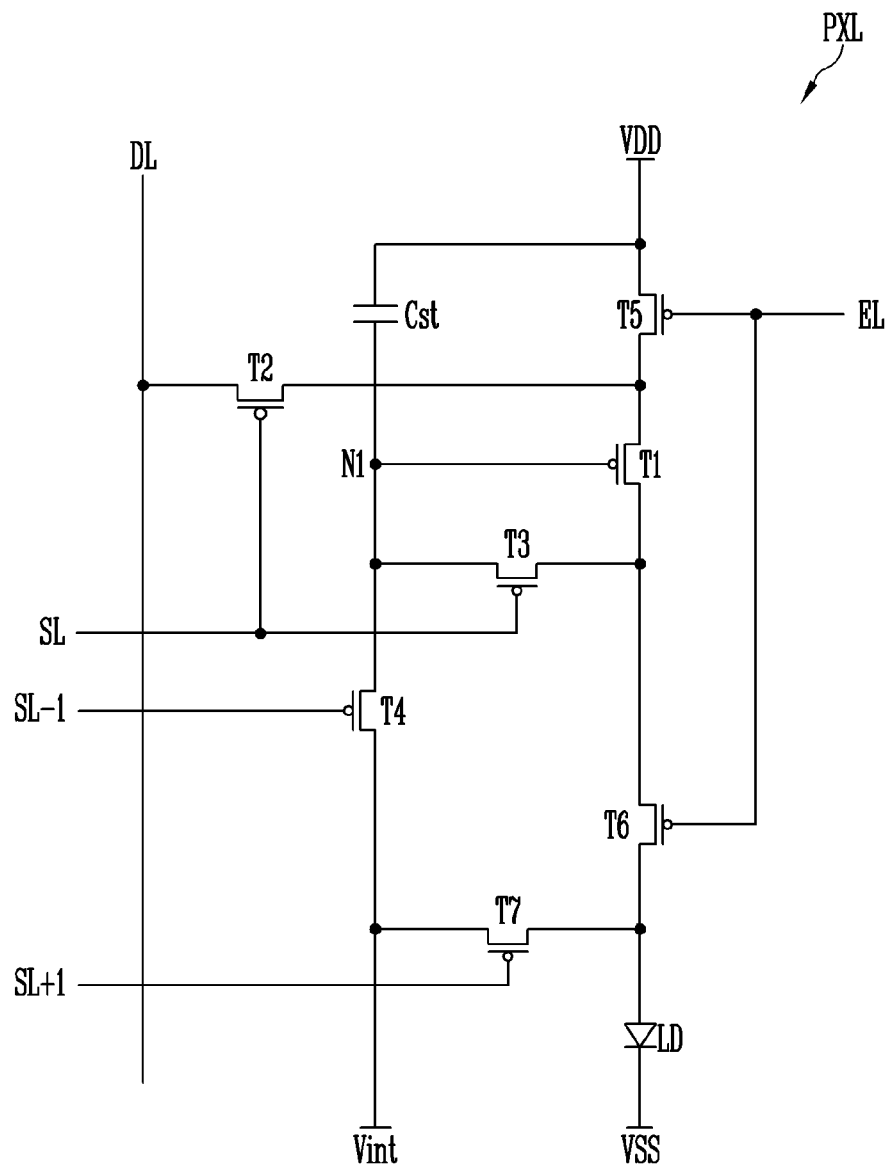
FIG. 4 is a schematic diagrams of an equivalent circuit of a pixel in accordance with an embodiment.

FIG. 4 is a schematic diagrams of an equivalent circuit of a pixel in accordance with an embodiment.

Referring to FIG. 4, each of the pixels PXL in accordance with an embodiment may include a light emitting element LD, first to seventh transistors T1, T2, T3, T4, T5, T6, and T7, and a storage capacitor Cst.

A first electrode (for example, an anode electrode) of the light emitting element LD may be connected to the first transistor T1 via the sixth transistor T6. A second electrode (for example, a cathode electrode) of the light emitting element LD may be connected to a second driving power supply VSS. The light emitting element LD may emit light having a luminance corresponding to current supplied from the first transistor T1.

The first transistor (driving transistor) T1 may include a first electrode connected to the first driving power supply VDD via the fifth transistor T5, and a second electrode connected to a first electrode of the light emitting element LD via the sixth transistor T6. The first transistor T1 may control, in response to the voltage of the first node N1 that is a gate electrode thereof, current flowing from the first driving power supply VDD to the second driving power supply VSS via the light emitting element LD.

The second transistor (switching transistor) T2 may be connected between a data line DL and the first electrode of the first transistor T1. A gate electrode of the second transistor T2 may be connected to a scan line SL. In case that a scan signal having a gate-on voltage is supplied to the scan line SL, the second transistor T2 may be turned on so that the data line DL may be electrically connected to the first electrode of the first transistor T1.

The third transistor T3 may be connected between the second electrode of the first transistor T1 and the first node N1. Furthermore, a gate electrode of the third transistor T3 may be connected to the scan line SL. In case that a scan signal having a gate-on voltage is supplied to the scan line SL, the third transistor T3 may be turned on so that the second electrode of the first transistor T1 may be electrically connected to the first node N1.

The fourth transistor T4 may be connected between the first node N1 and an initialization power supply Vint. Furthermore, a gate electrode of the fourth transistor T4 may be connected to a scan line SL−1 of a preceding stage. In case that a scan signal having a gate-on voltage is supplied to the scan line SL−1 of the preceding stage, the fourth transistor T4 is turned on so that the voltage of the initialization power supply Vint may be supplied to the first node N1. The initialization power supply Vint may be set to a voltage lower than that of a data signal.

The fifth transistor T5 may be connected between the first driving power supply VDD and the first electrode of the first transistor T1. A gate electrode of the fifth transistor T5 may be connected to the emission control line EL. The fifth transistor T5 may be turned on in case that an emission control signal having a gate-on voltage is supplied to the emission control line EL, and may be turned off in other cases.

The sixth transistor T6 may be connected between the second electrode of the first transistor T1 and the first electrode of the light emitting element LD. A gate electrode of the sixth transistor T6 may be connected to the emission control line EL. The sixth transistor T6 may be turned on in case that an emission control signal having a gate-on voltage is supplied to the emission control line EL, and may be turned off in other cases.

The seventh transistor T7 may be connected between the initialization power supply Vint and the first electrode (for example the anode electrode) of the light emitting element LD. A gate electrode of the seventh transistor T7 may be connected to a scan line SL+1 of a subsequent stage. In case that a scan signal having a gate-on voltage is supplied to the scan line SL+1 of the subsequent stage, the seventh transistor T7 may be turned on so that the voltage of the initialization power supply Vint may be supplied to the first electrode of light emitting element LD.

FIG. 4 illustrates a case where a gate electrode of the seventh transistor T7 is connected to the scan line SL+1 of the subsequent stage. However, the spirit and scope are not limited thereto. For example, in an embodiment, the gate electrode of the seventh transistor T7 may be connected to the scan line SL. In case that a scan signal of a gate-on voltage is supplied to the scan line SL, the voltage of the initialization power supply Vint may be supplied to the anode electrode of the light emitting element LD via the seventh transistor T7.

The storage capacitor Cst may be connected between the first driving power supply VDD and the first node N1. The storage capacitor Cst may store a voltage corresponding both to a data signal and to a threshold voltage of the first transistor T1.

Although in FIG. 4 the transistors, for example, the first to seventh transistors T1, T2, T3, T4, T5, T6, and T7, included in the driving circuit DC have been illustrated as being formed of P-type transistors, the disclosure is not limited to this. For example, at least one of the first to seventh transistors T1, T2, T3, T4, T5, T6, and T7 may be changed to an N-type transistor.

Figure 5:
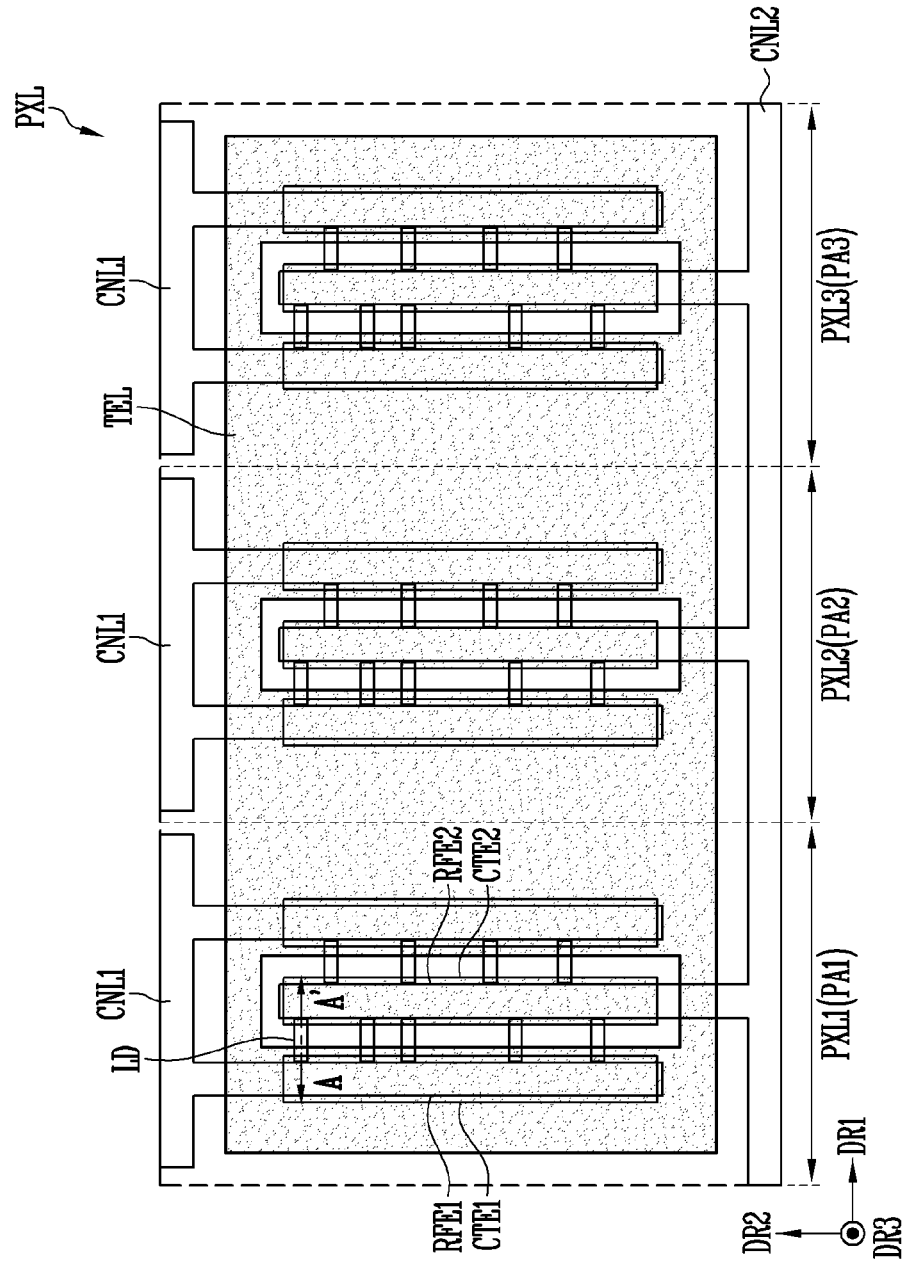
FIGS. 5 and 6 are schematic plan views of pixels in accordance with an embodiment.
Figure 6:
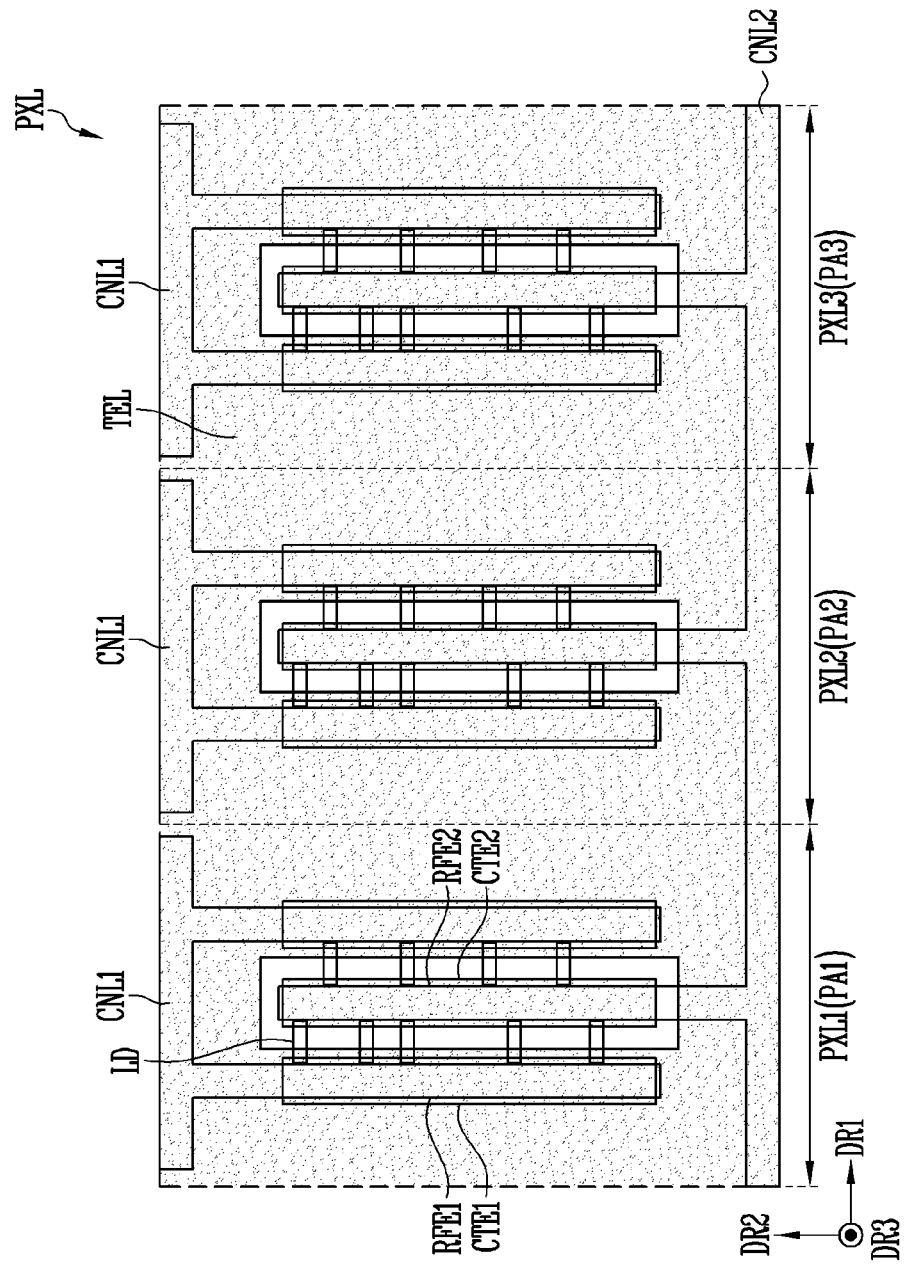
Figure 7:
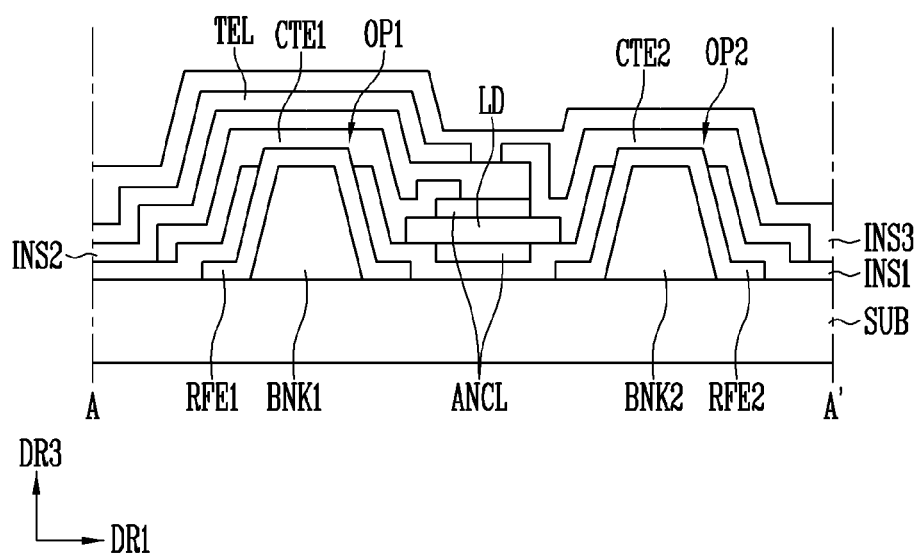
FIG. 7 is a sectional view of a pixel in accordance with an embodiment, and is a sectional view taken along line A-A' of FIG. 5.

FIGS. 5 and 6 are schematic plan views of pixels in accordance with an embodiment. FIG. 7 is a sectional view of a pixel in accordance with an embodiment, and is a sectional view taken along line A-A' of FIG. 5.

Although for the sake of explanation each electrode is simply illustrated as being formed of a single electrode layer, the disclosure is not limited thereto. In an embodiment, the expression "components are formed and/or disposed on the same layer" may mean that the components may be formed through the same process and may be formed of the same material.

Referring to FIGS. 2, 5 to 7, the display device 1000 may include a substrate SUB including pixel areas PA1, PA2, and PA3, and pixels PXL provided on the substrate SUB. The pixels PXL may include a first pixel PXL1, a second pixel PXL2, and a third pixel PXL3. The first pixel PXL1 may be disposed in a first pixel area PA1, the second pixel PXL2 may be disposed in a second pixel area PA2, and the third pixel PXL3 may be disposed in a third pixel area PA3.

Each of the pixels PXL may include first and second banks BNK1 and BNK2 disposed on the substrate SUB, first and second electrodes RFE1 and RFE2, a first insulating layer INS1, a light emitting element LD, third and fourth electrodes CTE1 and CTE2, a second insulating layer INS2, and a third insulating layer INS3. In an embodiment, each of the pixels PXL may further include an anchor layer ANCL and a partition wall (not shown) disposed along a boundary of each pixel PXL.

The substrate SUB may be a rigid substrate or a flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

The first bank BNK1 and the second bank BNK2 may be provided on the substrate SUB. A space in which the light emitting element LD is disposed may be provided between the first bank BNK1 and the second bank BNK2. In an embodiment, the first bank BNK1 and the second bank BNK2 may be provided on the substrate SUB to be spaced apart from each other in the first direction DR1 by the length of the light emitting element LD. Furthermore, the first bank BNK1 and the second bank BNK2 may extend in a second direction DR2 that intersects the first direction DR1.

The first bank BNK1 and the second bank BNK2 may be an insulating material including an organic material or an inorganic material. However, the material of the first bank BNK1 and the second bank BNK2 is not limited thereto.

Each of the first bank BNK1 and the second bank BNK2 may have a trapezoidal shape with sides inclined at an angle. The first bank BNK1 and the second bank BNK2 are not limited to the above-described shape, and may have various shapes such as a semi-elliptical shape, a circular shape, and a square shape.

The first electrode RFE1 (or the first pixel electrode) and the second electrode RFE2 (or the second pixel electrode) may be provided on the substrate SUB. Although for the sake of explanation the first and second electrodes RFE1 and RFE2 are illustrated as being directly provided on the substrate SUB, the disclosure is not limited thereto. For example, a component (for example, a pixel circuit) for allowing the display device to be driven as a passive matrix or an active matrix may be further provided between the substrate SUB and the first and second electrodes RFE1 and RFE2.

In an embodiment, the first electrode RFE1 and the second electrode RFE2 may be provided on the corresponding first and second banks BNK1 and BNK2, respectively. For example, the first electrode RFE1 may be provided on the first bank BNK1, and the second electrode RFE2 may be provided on the second bank BNK2.

The first electrode RFE1 and the second electrode RFE2 may be disposed to have substantially uniform thicknesses along the surfaces of the first bank BNK1 and the second bank BNK2, and the first electrode RFE1 and the second electrode RFE2 may be provided to correspond to the shapes of the first bank BNK1 and the second bank BNK2. For example, the first electrode RFE1 may have a shape corresponding to the inclination of the first bank BNK1, and the second electrode RFE2 may have a shape corresponding to the inclination of the second bank BNK2.

The first electrode RFE1 and the second electrode RFE2 may be provided on the substrate SUB to be spaced apart from each other in the first direction DR1 with the light emitting element LD interposed therebetween and to extend in the second direction DR2.

In an embodiment, the first electrode RFE1 may be disposed adjacent to the first end of each light emitting element LD and may be electrically connected to each light emitting element LD through the third electrode CTE1. The second electrode RFE2 may be disposed adjacent to the second end of each light emitting element LD and may be electrically connected to each light emitting element LD through the fourth electrode CTE2.

The first electrode RFE1 and the second electrode RFE2 may be disposed on a same plane and have a same height.

If the first electrode RFE1 and the second electrode RFE2 have a same height, the light emitting element LD may be more reliably connected to the first electrode RFE1 and the second electrode RFE2.

The first electrode RFE1 and the second electrode RFE2 may be formed of conductive material. The conductive material may include metal, for example, Ag, Mg, Al, Pt, Pd, Au, Ni, Nd, Ir, Cr, Ti, and an alloy thereof. However, the conductive material is not limited thereto.

Furthermore, each of the first electrode RFE1 and the second electrode RFE2 may have a single-layer structure, but the disclosure is not limited thereto. Each of the first and second electrodes RFE1 and RFE2 may have a multi-layer structure. For example, each of the first electrode RFE1 and the second electrode RFE2 may further include a capping layer (not illustrated) formed of transparent conductive material. The capping layer may be disposed to cover or overlap the first electrode RFE1 and the second electrode RFE2 so that the first electrode RFE1 and the second electrode RFE2 may be prevented from being damaged during a process of manufacturing the display device.

Here, the material of the first electrode RFE1 and the second electrode RFE2 is not limited to the above-mentioned materials. For example, the first electrode RFE1 and the second electrode RFE2 may include conductive material having a reflectivity. In case that the first electrode RFE1 and the second electrode RFE2 are made of conductive material having a reflectivity, light emitted from the opposite ends of the light emitting element LD may be reflected by the first electrode RFE1 and the second electrode RFE2 to travel in a display direction (for example, a third direction DR3).

For example, the first electrode RFE1 and the second electrode RFE2 may have shapes corresponding to the shapes of the first bank BNK1 and the second bank BNK2, and may have an angle with the substrate SUB. Light emitted from both ends of each of the light emitting elements LD may be reflected by the first electrode RFE1 and the second electrode RFE2 to further travel in the third direction DR3. Therefore, the light output efficiency of the display device may be improved.

Any one of the first and second electrodes RFE1 and RFE2 may be an anode electrode, and the other may be a cathode electrode.

As shown in FIG. 5, the first electrode RFE1 may be connected to the first connection line CNL1, and the second electrode RFE2 may be connected to the second connection line CNL2. In an embodiment, the first connection line CNL1 may be integral with the first electrode RFE1, and the second connection line CNL2 may be integral with the second electrode RFE2. In an embodiment, the first connection line CNL1 and the second connection line CNL2 may be formed separately from the first electrode RFE1 and the second electrode RFE2 to be electrically connected to each other through a separate via hole or contact hole.

Referring to FIG. 3A, the first electrode RFE1 and the second electrode RFE2 may be electrically connected to the pixel driving circuit DC and the second driving power supply VSS through the first connection line CNL1 and the second connection line CNL2, respectively.

The first electrode RFE1 and the second electrode RFE2 may be respectively connected to the first end and the second end of the light emitting element LD so that the driving signal may be provided to the light emitting element LD. The light emitting element LD may emit light having a luminance corresponding to driving current provided from the driving circuit DC.

The first insulating layer INS1 may be provided on the first electrode RFE1 and the second electrode RFE2. The first insulating layer INS1 may be entirely provided on the substrate SUB to cover or overlap the first and second banks BNK1 and BNK2 and the first and second electrodes RFE1 and RFE2, which are described above. Furthermore, the first insulating layer INS1 may be disposed along a surface of the substrate SUB where the first and second banks BNK1 and BNK2 and the first and second electrodes RFE1 and RFE2 are not disposed.

In an embodiment, the first insulating layer INS1 may be an inorganic insulating layer formed of inorganic material. The first insulating layer INS1 may be disposed to have a substantially uniform thickness along the surfaces of the substrate SUB and the first and second electrodes RFE1 and RFE2, and at least a partially empty space may be formed between the first insulating layer INS1 and the light emitting element LD disposed on the first insulating layer INS1. In an embodiment, the first insulating layer INS1 may include an organic insulating layer formed of organic material. The first insulating layer INS1 may fill a space between the substrate SUB and the light emitting element LD and reliably support the light emitting element LD.

The first insulating layer INS1 may include a first opening OP1 and a second opening OP2. The first opening OP1 and the second opening OP2 may expose at least a portion of the first electrode RFE1 and the second electrode RFE2.

The first and second openings OP1 and OP2 may be formed to overlap the corresponding first and second electrodes RFE1 and RFE2, respectively. For example, the first opening OP1 may be formed to overlap the first electrode RFE1, and the second opening OP2 may be formed to overlap the second electrode RFE2.

The first opening OP1 and the second opening OP2 may have a thickness and/or a depth corresponding to the thickness of the first insulating layer INS1. For example, the first opening OP1 and the second opening OP2 may completely penetrate the first insulating layer INS1 in a corresponding area. Thus, the first and second electrodes RFE1 and RFE2 may be exposed to the outside to contact third and fourth electrodes CTE1 and CTE2 that will be described later.

The light emitting element LD may be disposed on the first insulating layer INS1. The light emitting element LD may be disposed in a space provided by the first bank BNK1 and the second bank BNK2, and may be electrically connected between the first electrode RFE1 and the second electrode RFE2. For example, the first end of the light emitting element LD may be electrically connected to the first electrode RFE1, and the second end of the light emitting element LD may be electrically connected to the second electrode RFE2.

The third electrode CTE1 (or the first contact electrode) and the fourth electrode CTE2 (or the second contact electrode) may be provided on the first insulating layer INS1 and the light emitting element LD. Furthermore, the second insulating layer INS2 may be provided between the third electrode CTE1 and the fourth electrode CTE2.

The third electrode CTE1 and the fourth electrode CTE2 may contact one of opposite ends of each light emitting element LD. For example, the third electrode CTE1 may contact the first end of each light emitting element LD, and the fourth electrode CTE2 may contact the second end of each light emitting element LD.

In a plan view, the third electrode CTE1 may cover or overlap the first electrode RFE1 and overlap the first electrode RFE1. The third electrode CTE1 may be electrically connected to the first electrode RFE1 through the first opening OP1 of the first insulating layer INS1.

In a plan view, the fourth electrode CTE2 may cover or overlap the second electrode RFE2 and overlap the second electrode RFE2. The fourth electrode CTE2 may be electrically connected to the second electrode RFE2 through the second opening OP2 of the first insulating layer INS1.

Each of the third and fourth electrodes CTE1 and CTE2 may be formed of a transparent conductive material. For example, the transparent conductive material may include ITO, IZO, ITZO, etc., within the spirit and the scope of the disclosure. In case that the third and fourth electrodes CTE1 and CTE2 are formed of a transparent conductive material, loss may be reduced in case that light emitted from the light emitting element LD travels in the third direction DR3. Materials of the third and fourth electrodes CTE1 and CTE2 are not limited to the above-described materials.

The second insulating layer INS2 may be disposed between the third electrode CTE1 and the fourth electrode CTE2. In detail, the second insulating layer INS2 may be disposed on the third electrode CTE1, and at least a portion of the fourth electrode CTE2 may be disposed on the second insulating layer INS2. The third and fourth electrodes CTE1 and CTE2 may be disposed on different layers, and may be insulated from each other by the second insulating layer INS2.

However, the arrangement of the third and fourth electrodes CTE1 and CTE2 is not limited thereto, and the third and fourth electrodes CTE1 and CTE2 may be disposed on a same layer. This will be described later.

Each of the pixels PXL may include an electrode pattern TEL (or a sensing electrode) provided on the substrate SUB. The electrode pattern TEL may be disposed on a same layer as one of various lines provided on the substrate SUB. In an embodiment, the electrode pattern TEL may be disposed on a same layer as the fourth electrode CTE2. The arrangement of the electrode pattern TEL is not limited thereto, and various embodiments thereof will be described later.

As described above, the electrode pattern TEL may be disposed on a same layer as the fourth electrode CTE2. Furthermore, the electrode pattern TEL may be formed simultaneously with the fourth electrode CTE2 and may include a same material or a similar material. For example, a base metal layer may be formed on the first insulating layer INS1 and the second insulating layer INS2, and the base metal layer may be patterned, thus simultaneously forming the fourth electrode CTE2 and the electrode pattern TEL.

The electrode pattern TEL may at least partially overlap the third electrode CTE1, and may be disposed in an area that does not overlap the fourth electrode CTE2 among the pixel areas PA1, PA2, and PA3 in a plan view.

The electrode patterns TEL disposed in the pixel areas PA1, PA2, and PA3 may be integrally connected to each other. However, without being limited thereto, the electrode patterns may be separately formed in the pixel areas PA1, PA2, and PA3. In other words, the electrode patterns TEL disposed in the pixel areas PA1, PA2, and PA3 may be spaced apart from each other. At this time, the electrode patterns TEL disposed in the pixel areas PA1, PA2, and PA3 may be electrically connected to each other via a separate connection pattern.

The electrode pattern TEL may function as a touch electrode layer of a touch sensor. In detail, the electrode pattern TEL may function as a sensing electrode of a self-capacitance type touch sensor or a sensing electrode of a mutual-capacitance type touch sensor.

In this regard, the touch sensing function of the display device using the electrode pattern TEL as the touch electrode layer will be described in detail with further reference to FIGS. 8 and 9.

Figure 8:
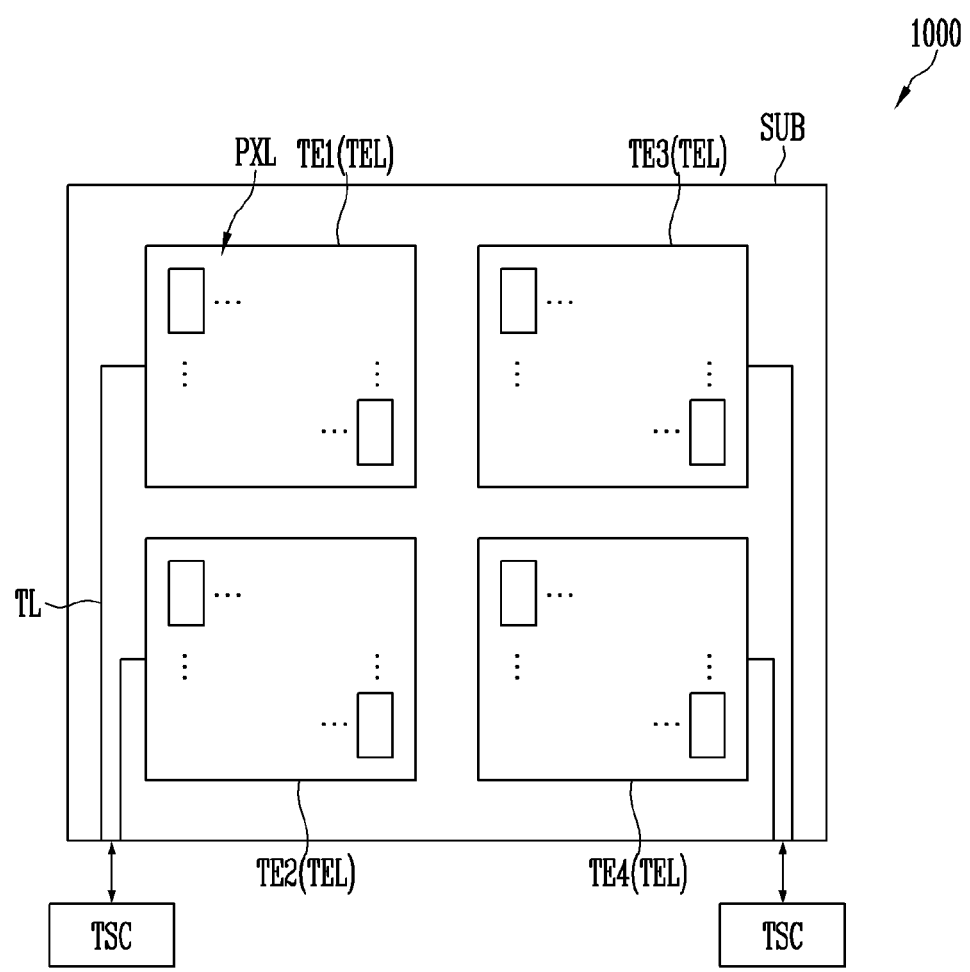
FIGS. 8 and 9 are schematic diagrams for explaining a touch sensing function of the display device in accordance with the disclosure.
Figure 9:
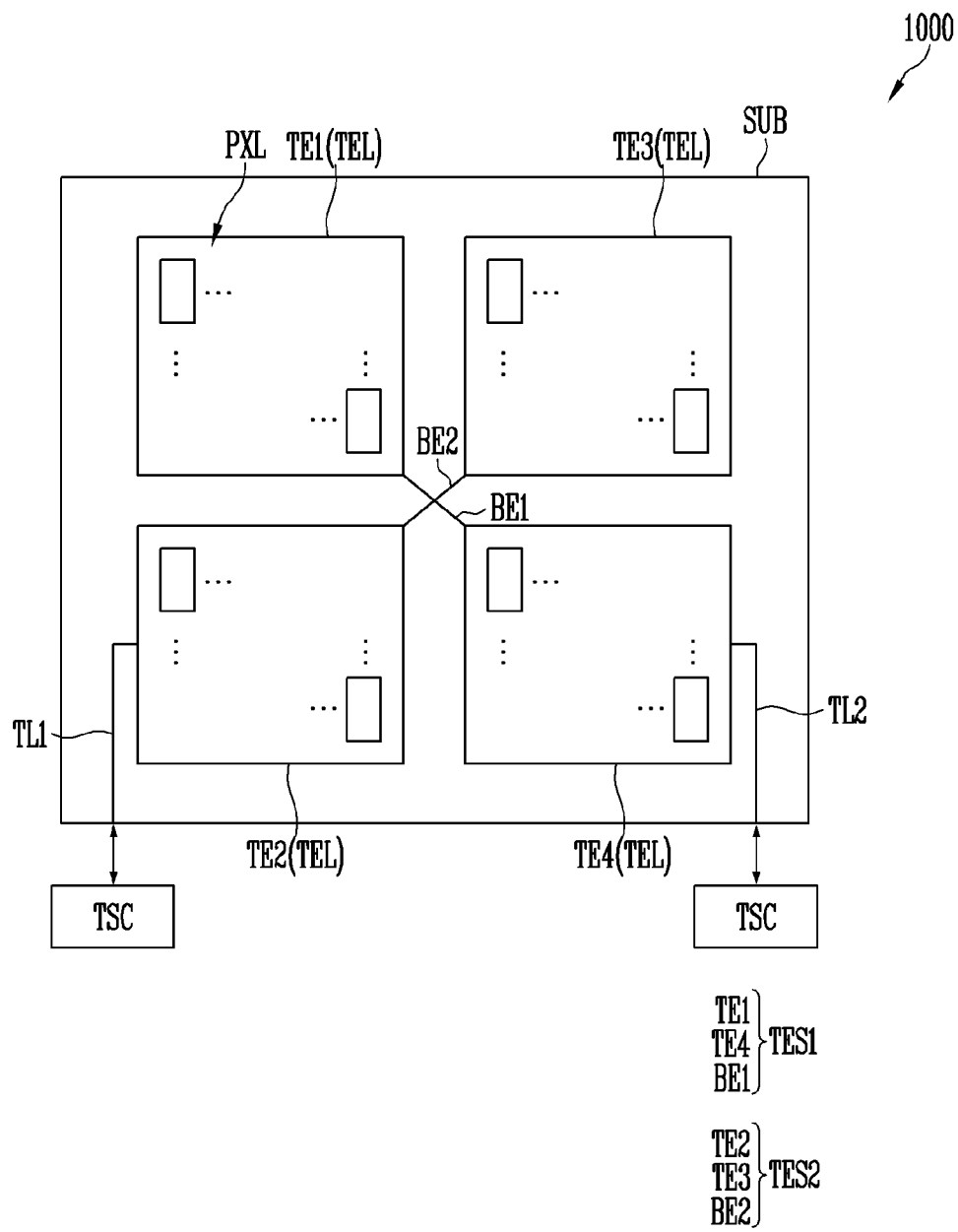

FIGS. 8 and 9 are schematic diagrams for explaining the touch sensing function of the display device in accordance with the disclosure. For example, FIG. 8 illustrates the display device including the self-capacitance type touch sensor, and FIG. 9 illustrates the display device including the mutual-capacitance type touch sensor.

Referring to FIGS. 8 and 9, the display device 1000 may include sensing electrode components TE1, TE2, TE3, and TE4 disposed on the substrate SUB. For the convenience of explanation, FIGS. 8 and 9 illustrate a structure in which four sensing electrode components TE1, TE2, TE3 and TE4 are disposed on the substrate SUB. However, of course, a larger number of sensing electrode components may be disposed.

Each of the sensing electrode components TE1, TE2, TE3, and TE4 may be formed to have a size corresponding to the pixels PXL. For instance, each of the sensing electrode components TE1, TE2, TE3, and TE4 may be formed to have a size corresponding to 10 to 300 pixels PXL, but is not limited thereto.

Each of the sensing electrode components TE1, TE2, TE3, and TE4 may be a sensing electrode formed with the above-described electrode pattern TEL. For example, each of the sensing electrode components TE1, TE2, TE3, and TE4 may be formed with the electrode pattern TEL formed integrally on the pixels PXL, or the electrode patterns TEL formed on each of the pixels PXL may be electrically connected to each other.

In case that the display device 1000 may include the self-capacitance type touch sensor, as shown in FIG. 8, each of the sensing electrode components TE1, TE2, TE3, and TE4 may be connected to a tough sensing line TL, and may be electrically connected through the touch sensing line TL to a touch sensing controller TSC (or an input sensing controller).

The touch sensing controller TSC may be formed as one controller or controllers on the substrate SUB to provide a touch driving signal to the touch sensing lines TL or to receive a touch sensing signal from the touch sensing lines TL. The position of the touch sensing controller TSC is not limited thereto, and the touch sensing controller TSC may be formed on a separate member to be connected thereto by other lines.

As described above, the sensing electrode components TE1, TE2, TE3, and TE4 of FIG. 8 may function as the sensing electrode of the self-capacitance type touch screen panel.

For example, if an external conductor (for example a user's finger) touches (or is adjacent to) the display device 1000, the self-capacitance value of at least one of the sensing electrode components TE1, TE2, TE3, and TE4 may be changed at the touched position. Such a change in self-capacitance value may become the touch sensing signal for sensing a touch, and the touch sensing signal may be provided to the touch sensing controller TSC through the touch sensing line TL. The touch sensing controller TSC (or an execution processing device connected to the touch sensing controller TSC) may determine a position where the external conductor is touched based on a touch sensing signal according to a change in the capacitance value.

In case that the display device 1000 may include the mutual-capacitance type touch sensor, as shown in FIG. 9, the sensing electrode components TE1, TE2, TE3, and TE4 may form sensing electrode strings TES1 and TES2, and the sensing electrode strings TES1 and TES2 may be electrically connected through touch sensing lines TL1 and TL2 to the touch sensing controller TSC.

In detail, the first sensing electrode component TE1 may be connected to the fourth sensing electrode component TE4 through a first connection line BE1. The fourth sensing electrode component TE4 may be connected to the second touch sensing line TL2, and may be connected to the touch sensing controller TSC through the second touch sensing line TL2. In other words, the first sensing electrode component TE1, the fourth sensing electrode component TE4, and the first connection line BE1 may form a first sensing electrode string TES1.

The third sensing electrode component TE3 may be connected to the second sensing electrode component TE2 through a second connection line BE2. The second sensing electrode component TE2 may be connected to the first touch sensing line TL1, and may be connected to the touch sensing controller TSC through the first touch sensing line TL1. In other words, the second sensing electrode component TE2, the third sensing electrode component TE3, and the second connection line BE2 may form a second sensing electrode string TES2.

Although FIG. 9 shows only one first sensing electrode string TES1 and one second sensing electrode string TES2, first sensing electrode strings TES1 and second sensing electrode strings TES2 may be disposed on the substrate SUB.

The first sensing electrode string TES1 and the second sensing electrode string TES2 may be disposed to intersect each other. Furthermore, a separate insulating layer or insulating pattern may be formed between the first sensing electrode string TES1 and the second sensing electrode string TES2, and the first sensing electrode string TES1 and the second sensing electrode string TES2 may be insulated from each other.

The touch sensing controller TSC may provide the touch driving signal to either of the first sensing electrode string TES1 and the second sensing electrode string TES2 through the touch sensing lines TL1 and TL2, and may receive a touch signal generated from a remaining sensing electrode string.

As described above, the sensing electrode components TE1, TE2, TE3, and TE4 of FIG. 9 may function as the sensing electrode of the mutual-capacitance type touch screen panel.

The mutual capacitance value may be formed between the first sensing electrode component TE1 and the fourth sensing electrode component TE4 of the first sensing electrode string TES1 and between the second sensing electrode component TE2 and the third sensing electrode component TE3 of the second sensing electrode string TES2. If the external conductor (for example a user's finger) touches (or is adjacent to) the display device 1000, a mutual capacitance value formed between the respective sensing electrode components TE1, TE2, TE3, and TE4 may be changed at the touched position. Such a change in mutual-capacitance value may become the touch sensing signal for sensing a touch, and the touch sensing signal may be provided to the touch sensing controller TSC through the touch sensing lines TL1 and TL2. The touch sensing controller TSC (or an execution processing device connected to the touch sensing controller TSC) may determine a position where the external conductor is touched based on a touch sensing signal according to a change in the given mutual-capacitance value.

Referring back to FIGS. 5 to 7, a third insulating layer INS3 may be provided on the fourth electrode CTE2 and the electrode pattern TEL. The third insulating layer INS3 may cover or overlap the fourth electrode CTE2 and the electrode pattern TEL to prevent the fourth electrode CTE2 and the electrode pattern TEL from being damaged. The third insulating layer INS3 may serve as an encapsulation layer that prevents oxygen and moisture from penetrating into the light emitting element LD.

The third insulating layer INS3 may include an inorganic insulating layer made of inorganic material or an organic insulating layer made of organic material. Although the third insulating layer INS3 may have a single layer structure as shown in the drawing, the disclosure is not limited thereto. For example, the third insulating layer may have a multi-layer structure including an organic insulating layer and an inorganic insulating layer.

Although not shown in the drawings, in an embodiment, a planarization layer (not shown) may be further provided on the third insulating layer INS3. The planarization layer may relieve a step difference caused by various components disposed thereunder. The planarization layer may include an organic insulating layer. However, without being limited thereto, the planarization layer may include an inorganic insulating layer.

Although the electrode pattern TEL has been described as a component of each pixel PXL, it may function as a sensing electrode that generates an electrical signal according to an external input such as a touch. For example, the electrode pattern TEL is not involved in the emission of the light emitting element LD disposed in each of the pixels PXL, and may be a sensing electrode constituting the touch sensor.

As described above, the electrode pattern TEL may function as the sensing electrode of the touch sensor included in the display device. The electrode pattern TEL may be formed on a same layer as the fourth electrode CTE2, and may be formed simultaneously with the fourth electrode. For example, the display device according to the disclosure may omit a separate process for forming the sensing electrode of the touch sensor, simplify the manufacturing process of the display device, and reduce the manufacturing cost thereof. Furthermore, since the display device according to the disclosure does not include a separate sensing electrode layer for forming the sensing electrode of the touch sensor, it may be effective to implement a thin display device.

Hereinafter, pixels and a display device including the same according to other embodiments will be described. In the following embodiments, the same components as those of the previously described embodiments are denoted by the same reference numerals, descriptions thereof will be omitted or simplified, and differences will be described.

Figure 10:
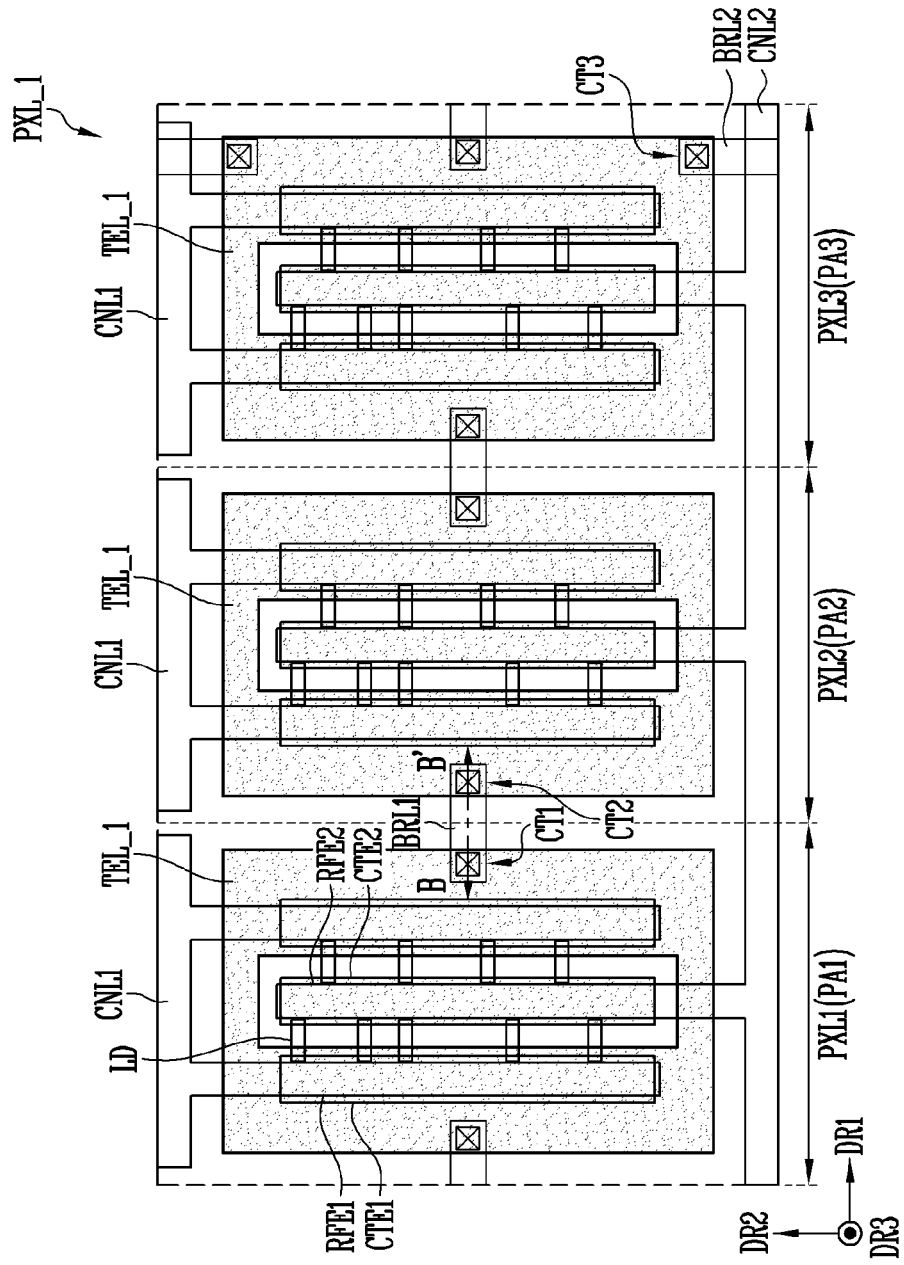
FIG. 10 is a sectional view illustrating pixels in accordance with an embodiment.
Figure 11A:
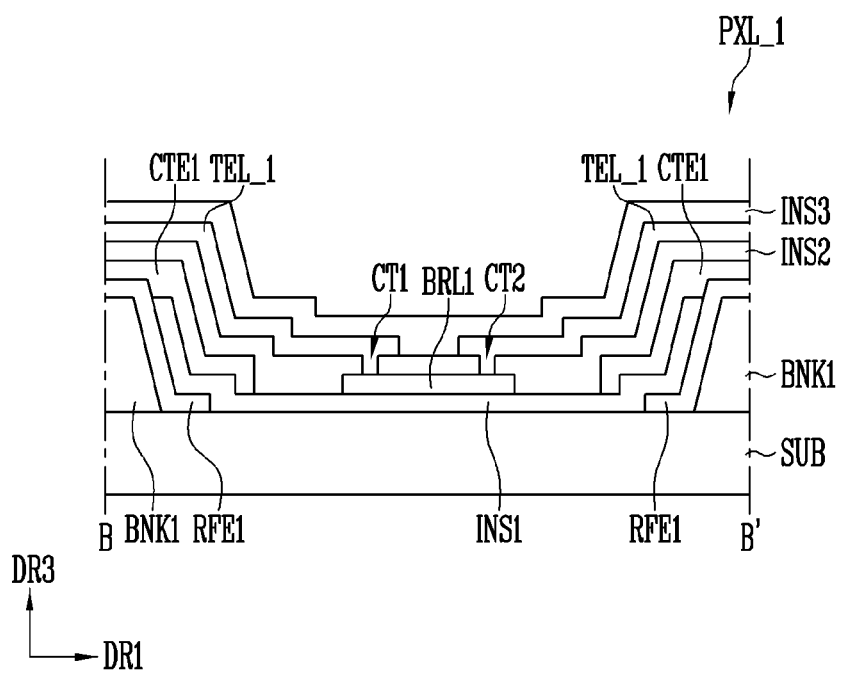
FIGS. 11A to 11C are sectional views of a pixel in accordance with various embodiments, corresponding to line B-B' of FIG. 10.
Figure 11B:
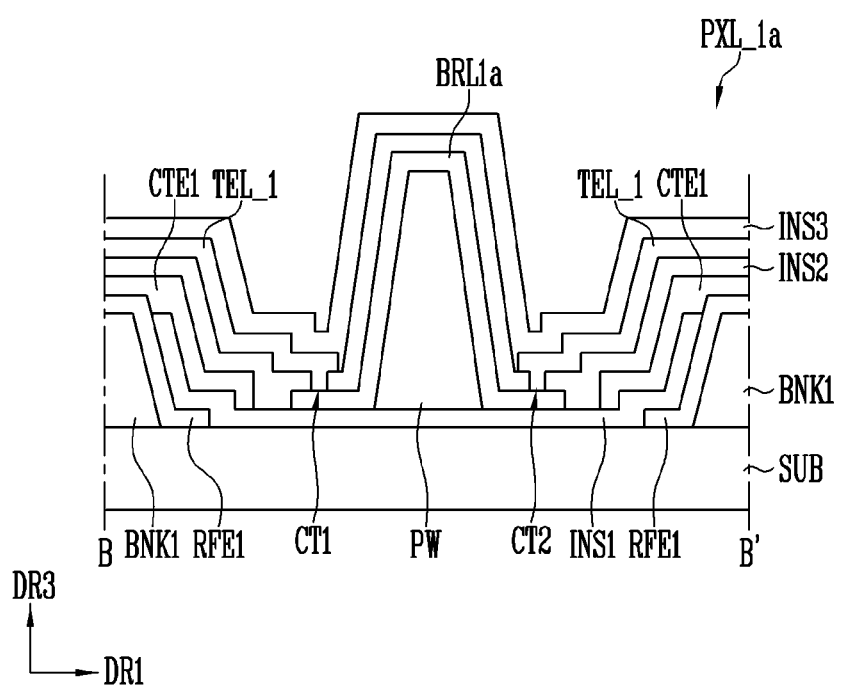
Figure 11C:
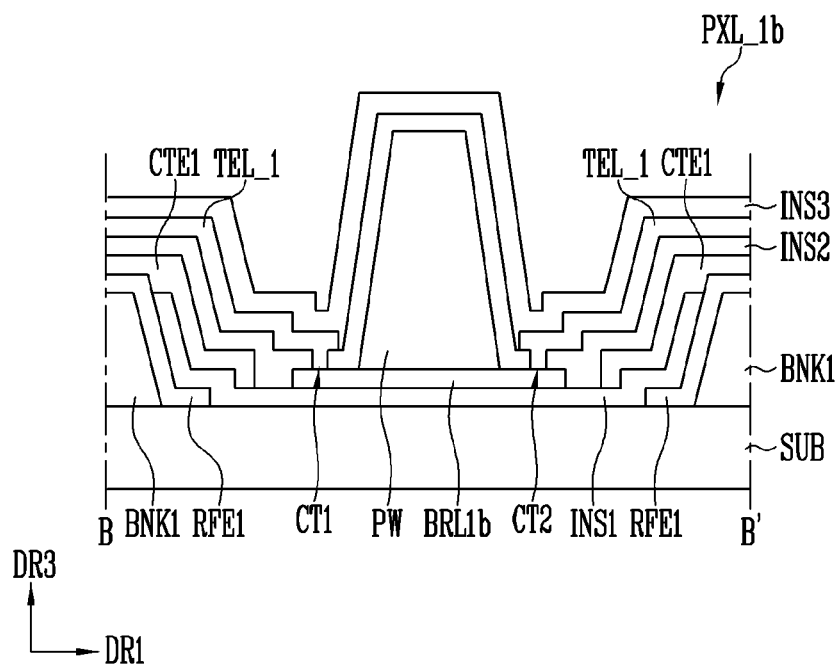

FIG. 10 is a sectional view illustrating pixels in accordance with an embodiment. FIGS. 11A to 11C are sectional views of a pixel in accordance with various embodiments, corresponding to line B-B' of FIG. 10.

An embodiment of FIGS. 10 to 11C may be different from an embodiment of FIGS. 5 to 7 in that the electrode patterns TEL_1 may be disposed in the pixel areas PA1, PA2, and PA3 to be spaced apart from each other, and connection patterns BRL1 and BRL2 may be further formed to connect the electrode patterns TEL_1 to each other.

Referring to FIGS. 10 to 11C, the pixels PXL_1 may include the electrode patterns TEL_1. The electrode patterns TEL_1 may be disposed in the pixel areas PA1, PA2, and PA3, and may be spaced apart from each other in a plan view. The electrode patterns TEL_1 may be disposed on a same layer as the fourth electrode CTE2.

The connection patterns BRL1 and BRL2 to connect adjacent electrode patterns TEL_1 may be formed between the electrode patterns TEL_1. The connection patterns BRL1 and BRL2 may include a first connection pattern BRL1 and a second connection pattern BRL2. The first connection pattern BRL1 may be a connection pattern to connect electrode patterns TEL_1 that are adjacent to each other in the first direction DR1, and the second connection pattern BRL2 may be a connection pattern to connect electrode patterns TEL_1 that are adjacent to each other in the second direction DR2.

For example, the electrode pattern TEL_1 (or the first electrode pattern) disposed in the first pixel area PA1 and the electrode pattern TEL_1 (or the second electrode pattern) disposed in the second pixel area PA2 may be disposed to be spaced apart from each other, and the first connection pattern BRL1 may electrically connect the first electrode pattern and the second electrode pattern.

The first connection pattern BRL1 may be disposed on a layer different from the electrode pattern TEL_1. In other words, the first connection pattern BRL1 may be disposed on a layer different from the fourth electrode CTE2. In an embodiment, the first connection pattern BRL1 may be disposed on a same layer as the third electrode CTE1, and may be disposed between the first insulating layer INS1 and the second insulating layer INS2. The first connection pattern BRL1 and the third electrode CTE1 may be simultaneously formed and include a same material or a similar material. For example, a base metal layer may be formed on the first insulating layer INS1, and the base metal layer may be patterned, thus simultaneously forming the third electrode CTE1 and the first connection pattern BRL1.

The second insulating layer INS2 to cover or overlap the first connection pattern BRL1 may include a first contactor CT1 and a second contactor CT2 exposing at least a portion of the first connection pattern BRL1. The electrode patterns TEL_1 adjacent to each other may contact the first connection pattern BRL1 through the first contactor CT1 and the second contactor CT2 of the second insulating layer INS2. FIG. 10 may also further include a third contactor CT3.

For example, the electrode pattern TEL_1 disposed in the first pixel area PA1 and the electrode pattern TEL_1 disposed in the second pixel area PA2 may be electrically connected to each other through the first connection pattern BRL1. The electrode pattern TEL_1 disposed in the first pixel area PA1 may contact the first connection pattern BRL1 through the first contactor CT1, and the electrode pattern TEL_1 disposed in the second pixel area PA2 may contact the first connection pattern BRL1 through the second contactor CT2.

As shown in FIGS. 11B and 11C, the partition wall (or bank) PW to enclose each of pixels PXL_1a and PXL_1b may be further provided on the substrate SUB along a boundary of each of the pixels PXL_1a and PXL_1b. The partition wall PW may be disposed on the first insulating layer INS1, but is not limited thereto. For example, the partition wall PW may be disposed between the substrate SUB and the first insulating layer INS1.

The partition wall PW may prevent light leakage from occurring between the adjacent pixels PXL_1a and PXL_1b. The partition wall PW may prevent a solution containing the light emitting element LD from leaking to adjacent pixels in the process of aligning the light emitting elements LD.

The first connection pattern BRL1 may be disposed above or under or below the partition wall PW. For instance, as shown in FIG. 11B, the first connection pattern BRL1a may be disposed on the partition wall PW. For example, the first connection pattern BRL1a may be disposed between the partition wall PW and the second insulating layer INS2. The first connection pattern BRL1a may be generally disposed along the surface of the partition wall PW. As another example, as shown in FIG. 11C, the first connection pattern BRL1b may be disposed under or below the partition wall PW. For example, the first connection pattern BRL1b may be disposed between the first insulating layer INS1 and the partition wall PW.

Since the connection relationship and structure of the second connection pattern BRL2 may be substantially the same as those of the first connection pattern BRL1, a detailed description thereof will be omitted.

As described above, in case that the electrode pattern TEL_1 is disposed in the pixel areas PA1, PA2, and PA3 to be spaced apart from each other, a parasitic capacitance value that may be generated between the electrode lines of the pixels PXL may be reduced as compared to a structure integrally formed in each of the pixel areas PA1, PA2, and PA3. In case that the parasitic capacitance value is reduced, a noise phenomenon caused by the parasitic capacitance may be reduced.

Figure 12A:
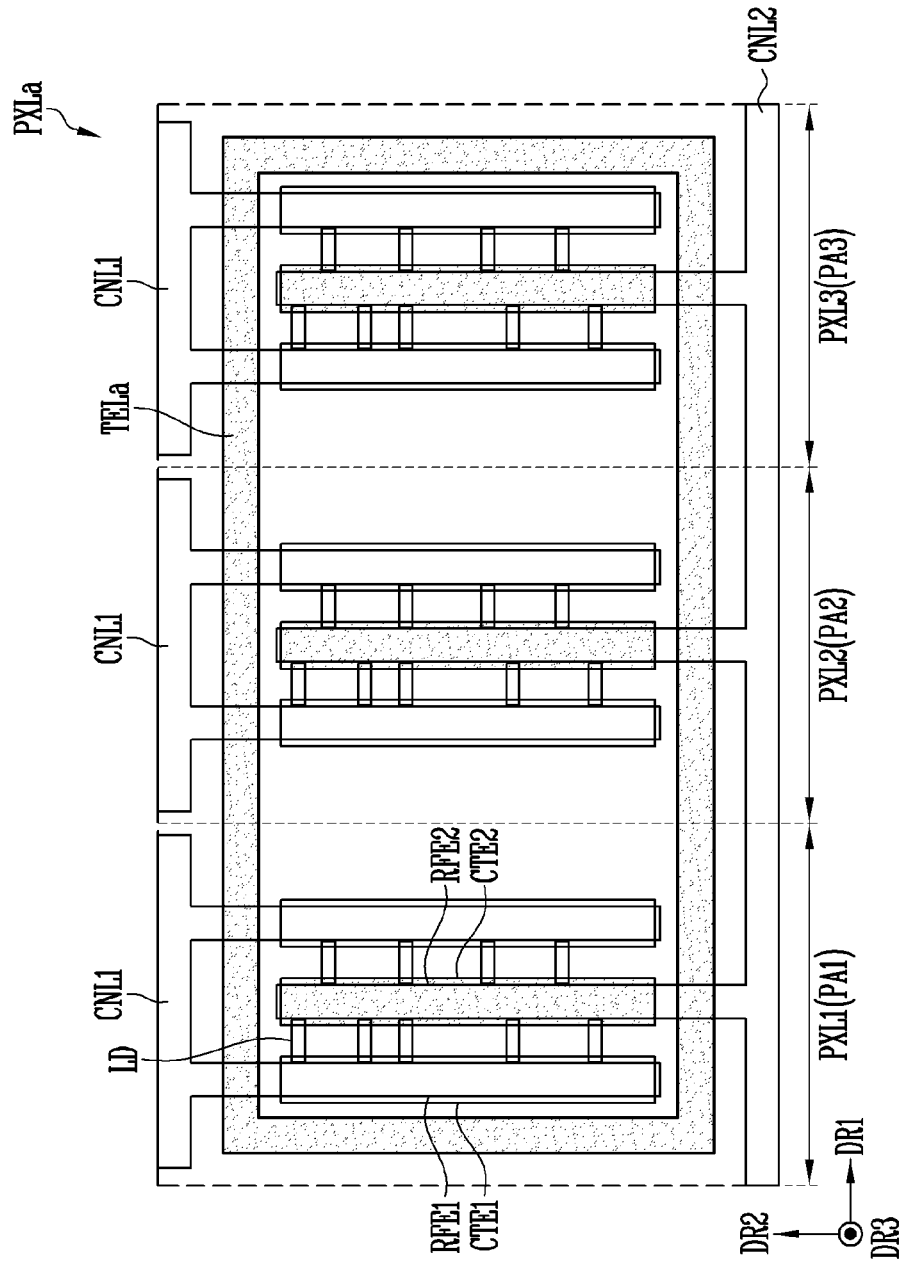
FIGS. 12A and 12B are schematic plan views illustrating pixels in accordance with an embodiment.
Figure 12B:
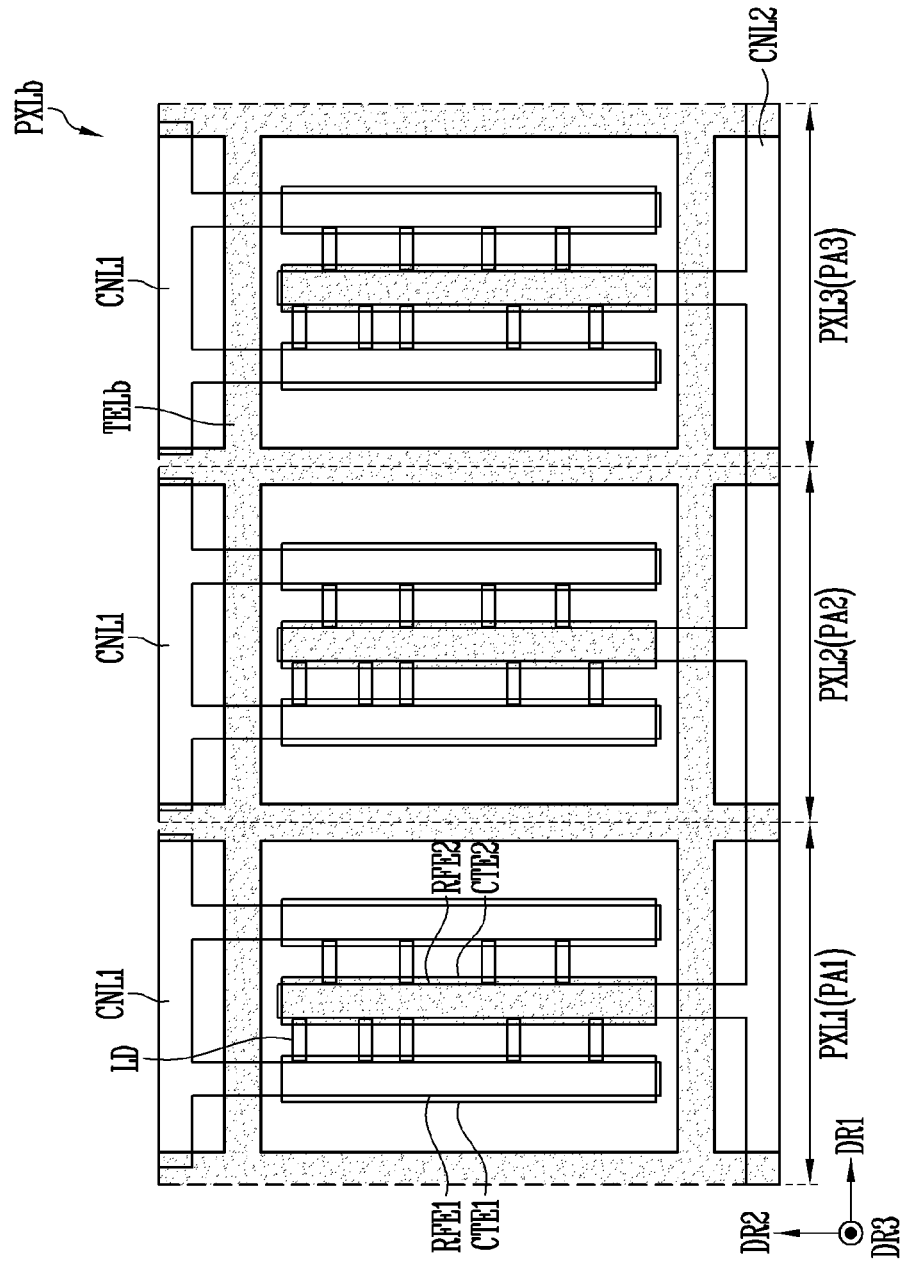

FIGS. 12A and 12B are schematic plan views illustrating pixels in accordance with an embodiment. FIGS. 12A and 12B illustrate various shapes of electrode patterns TELa and TELb.

Referring to FIG. 12A, the electrode pattern TELa may be disposed to enclose the third electrodes CTE1 and the fourth electrode CTE2 in a plan view. The electrode pattern TELa may have a single closed curve shape, and may have a fine wiring structure. The electrode pattern TELa may include a wide opening, and may have a window shape disposed along an edge of the opening.

Furthermore, referring to FIG. 12B, the electrode pattern TELb may be disposed along edges of the pixel areas PA1, PA2, and PA3 in a plan view, and may have a mesh shape having a fine wiring structure.

The shapes of the electrode patterns TELa and TELb are not limited thereto. The electrode patterns may have various shapes, as long as they may be disposed on a same layer as other wirings included in the pixels PXLa and PXLb.

Figure 13:
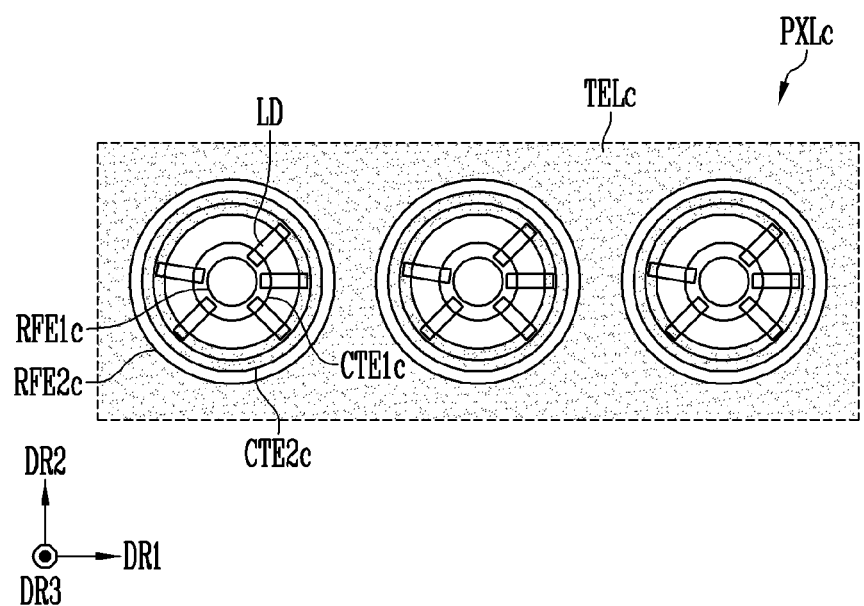
FIG. 13 is a schematic plan view illustrating pixels in accordance with an embodiment.

FIG. 13 is a schematic plan view illustrating pixels in accordance with an embodiment. An embodiment of FIG. 13 may be different from an embodiment of FIG. 5 in that each pixel may include circular electrodes in a plan view.

Referring to FIG. 13, each pixel PXLc may include a first electrode RFE1c, a second electrode RFE2c, a light emitting element LD, a third electrode CTE1c, a fourth electrode CTE2c, and an electrode pattern TELc.

The first electrode RFE1c and the second electrode RFE2c may be spaced apart from each other with the light emitting element LD interposed therebetween. For instance, the first electrode RFE1c and the second electrode RFE2c may be disposed so that one electrode surrounds the other electrode in a plan view. For example, the first electrode RFE1c may be enclosed by the second electrode RFE2c. For example, the first electrode RFE1c may be formed in a circular shape in a plan view, and the second electrode RFE2c may be formed in a shape (for example a donut shape) surrounding the first electrode RFE1c. The shapes of the first electrode RFE1c and the second electrode RFE2c are not limited thereto. For example, the first electrode RFE1c may have an elliptical shape or a polygonal shape such as a triangle or a square. Furthermore, if the second electrode RFE2c is also formed to surround the first electrode RFE1c, the shape thereof is not limited.

The light emitting element LD may be disposed between the first electrode RFE1c and the second electrode RFE2c. The first end of the light emitting element LD may be connected through the third electrode CTE1c to the first electrode RFE1c, and the second end thereof may be connected through the fourth electrode CTE2c to the second electrode RFE2c. The third electrode CTE1c and the fourth electrode CTE2c may at least partially overlap the first electrode RFE1c and the second electrode RFE2c, respectively.

The third electrode CTE1c and the fourth electrode CTE2c may also be formed similarly to the first electrode RFE1c and the second electrode RFE2c, respectively. For example, the third electrode CTE1c may overlap the first electrode RFE1c and may be formed in a circular shape in a plan view. Furthermore, the fourth electrode CTE2c may overlap the second electrode RFE2c and may be disposed in a shape (or a donut shape) surrounding the third electrode CTE1c. The third electrode CTE1c and the fourth electrode CTE2c are not limited thereto, and may have various shapes.

The electrode pattern TELc may be disposed on a same layer as any one of the above-described first electrode RFE1c, second electrode RFE2c, third electrode CTE1c, and fourth electrode CTE2c. For example, the electrode pattern TELc may be disposed on a same layer as the fourth electrode CTE2c. In an embodiment, the electrode pattern TELc may be disposed in an area that does not overlap the first electrode RFE1c, the second electrode RFE2c, the third electrode CTE1c, and the fourth electrode CTE2c, but is not limited thereto. For instance, the electrode pattern TELc may at least partially overlap the first electrode RFE1c and/or the third electrode CTE1c.

Figure 14:
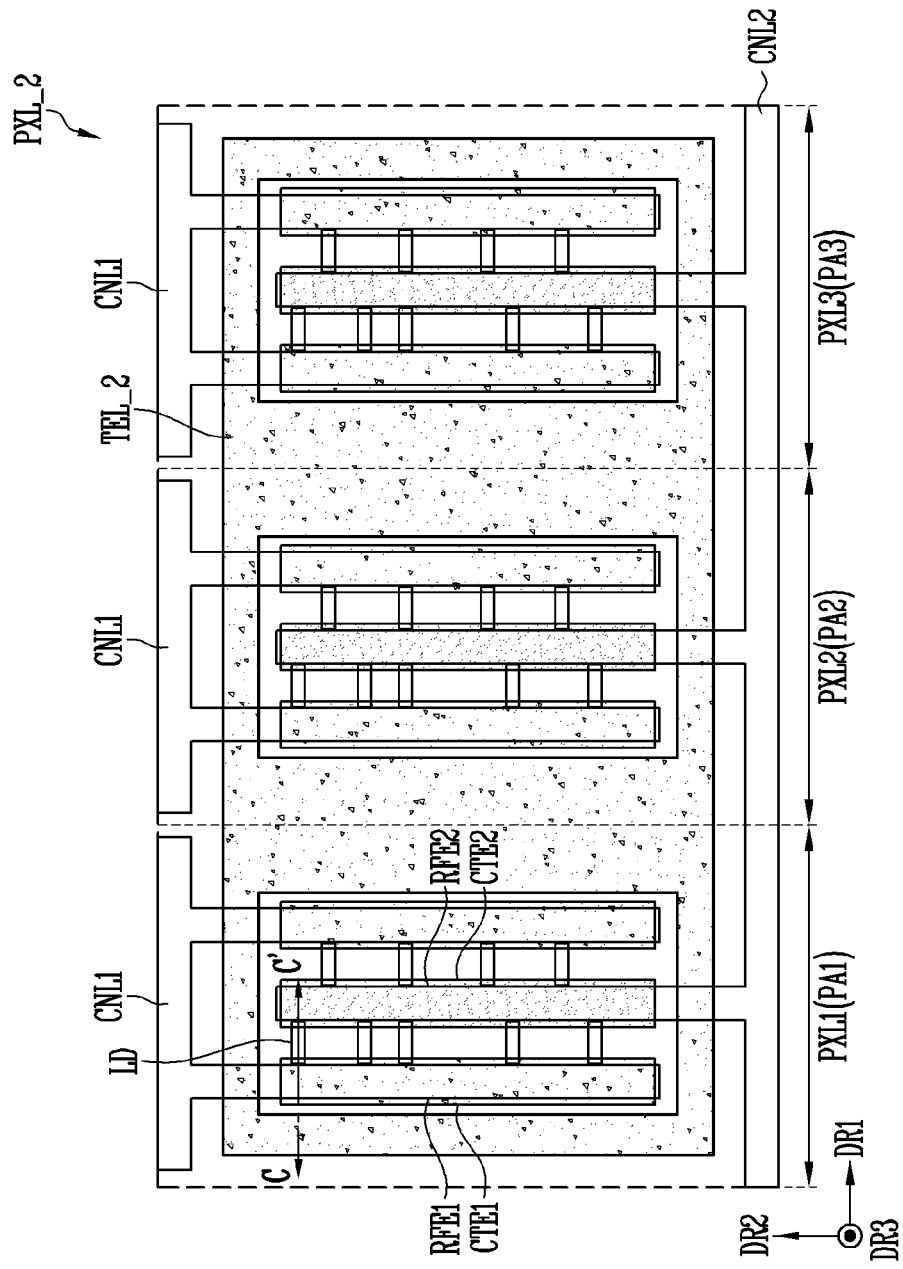
FIG. 14 is a schematic plan view illustrating pixels in accordance with an embodiment.
Figure 15A:
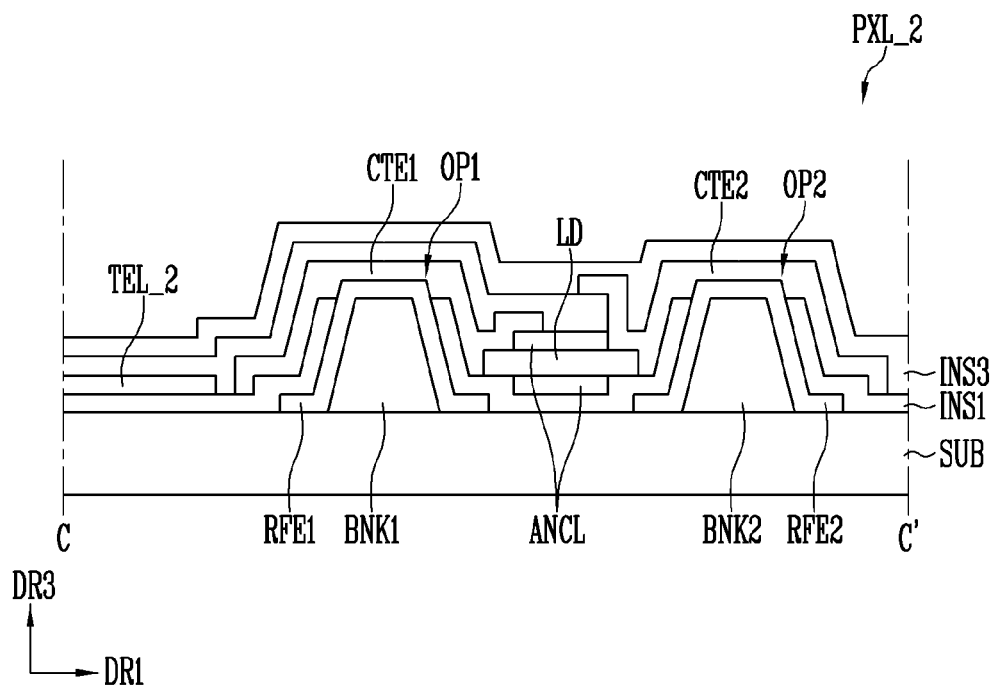
FIGS. 15A to 15C are sectional views of a pixel in accordance with various embodiments, corresponding to line C-C' of FIG. 14.
Figure 15B:
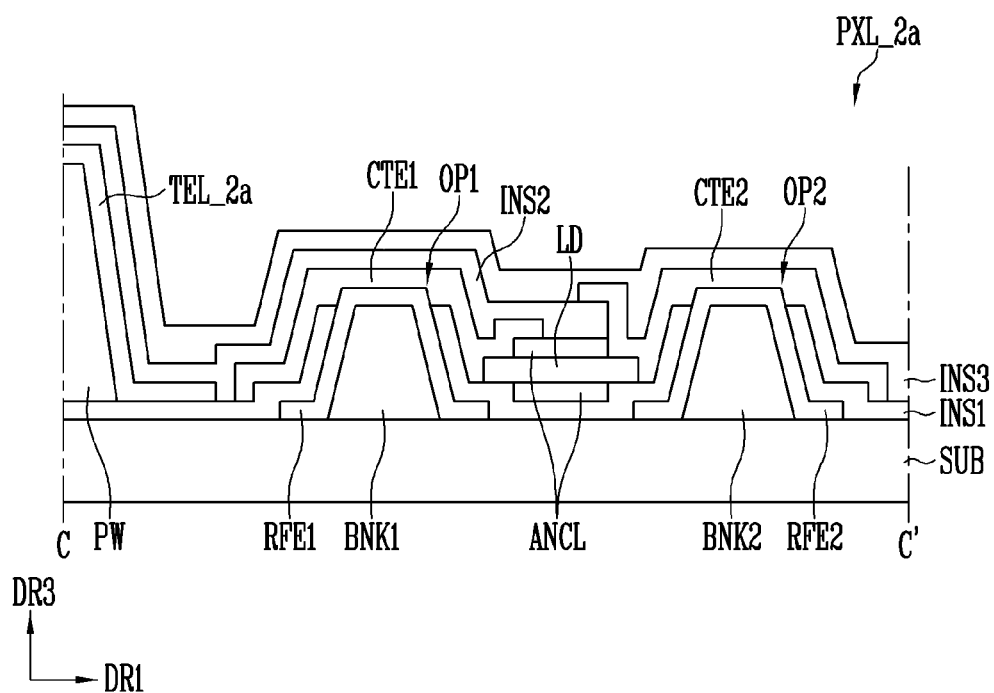
Figure 15C:
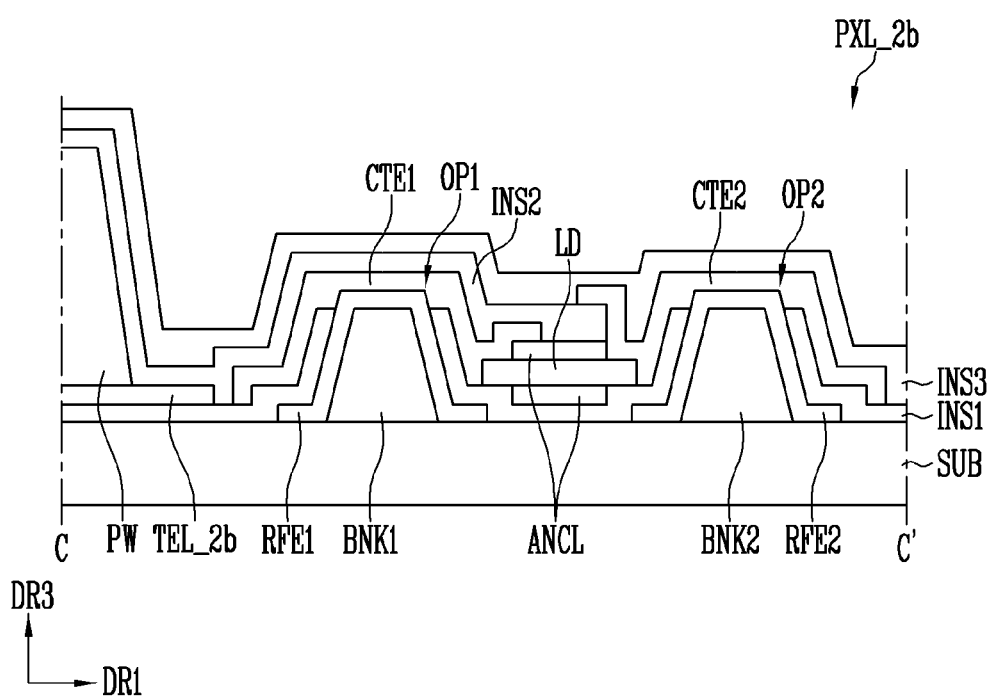

FIG. 14 is a schematic plan view illustrating pixels in accordance with an embodiment. FIGS. 15A to 15C are sectional views of a pixel in accordance with various embodiments, corresponding to line C-C' of FIG. 14.

An embodiment of FIGS. 14 to 15C may be different from an embodiment of FIGS. 5 to 7 in that the electrode pattern TEL_2 may be disposed on a same layer as the third electrode CTE1.

Referring to FIGS. 14 to 15C, each pixel PXL_2 may include the electrode pattern TEL_2. The electrode pattern TEL_2 may be disposed on a same layer as the third electrode CTE1.

The electrode pattern TEL_2 may be formed simultaneously with the third electrode CTE1 and may include a same material or a similar material. For example, a base metal layer may be formed on the first insulating layer INS1, and the base metal layer may be patterned, thus simultaneously forming the third electrode CTE1 and the electrode pattern TEL_2.

The electrode pattern TEL_2 may be disposed in an area that does not overlap the third electrode CTE1 and the fourth electrode CTE2 among the pixel areas PA1, PA2, and PA3.

The electrode patterns TEL_2 disposed in the pixel areas PA1, PA2, and PA3 may be integrally connected to each other. However, without being limited thereto, the electrode patterns may be separately formed in the pixel areas PA1, PA2, and PA3.

As shown in FIGS. 15B and 15C, the partition wall PW may be disposed along the boundary of the pixels PXL_2a and PXL_2b, and the electrode pattern TEL_2 may be disposed above or under or below the partition wall PW. For instance, as shown in FIG. 15B, the electrode pattern TEL_2a may be disposed on the partition wall PW. For example, the electrode pattern TEL_2a may be disposed between the partition wall PW and the second insulating layer INS2. As another example, as shown in FIG. 15C, the electrode pattern TEL_2b may be disposed under or below the partition wall PW. For example, the electrode pattern TEL_2b may be disposed between the first insulating layer INS1 and the partition wall PW.

Figure 16:
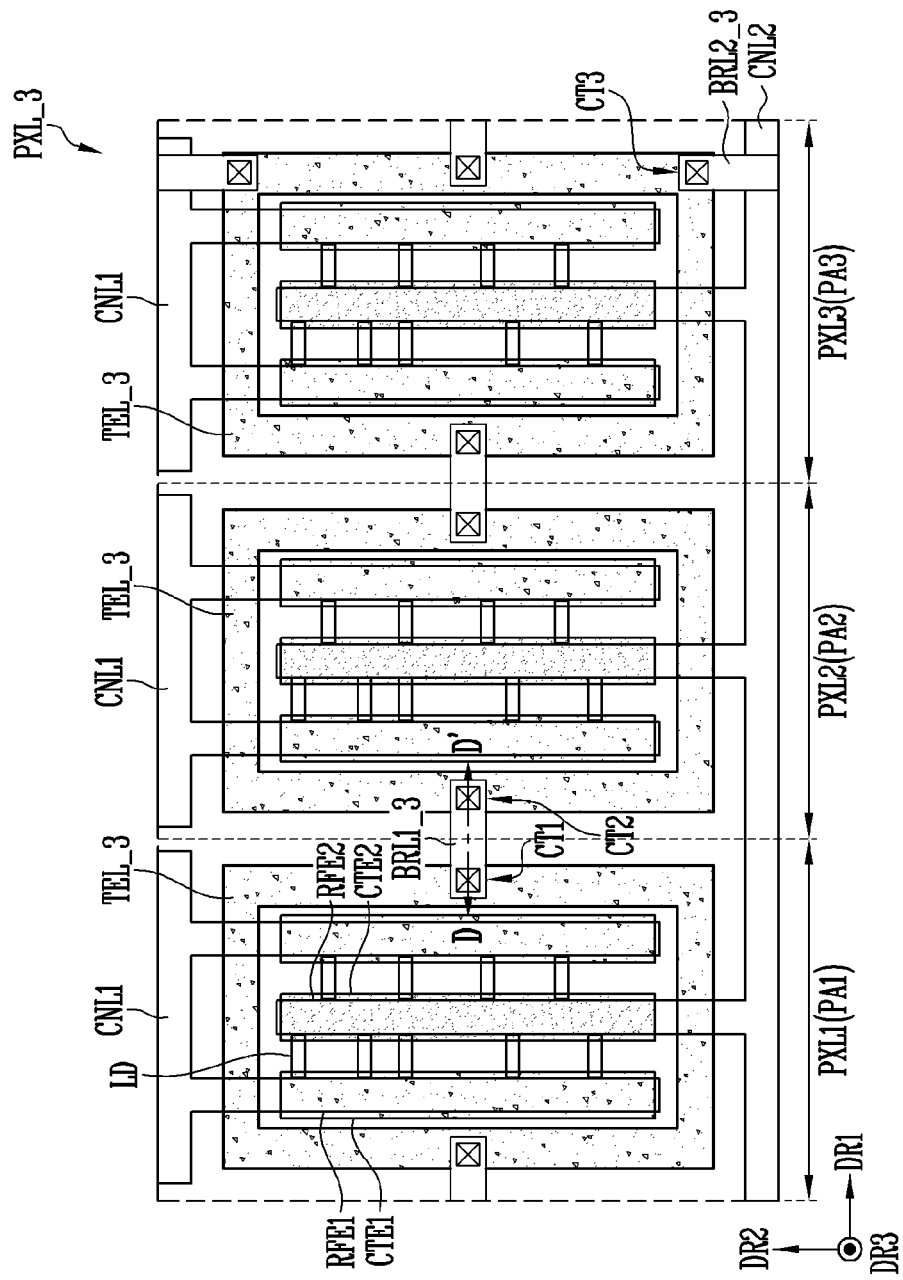
FIG. 16 is a schematic plan view illustrating a display device in accordance with an embodiment.
Figure 17A:
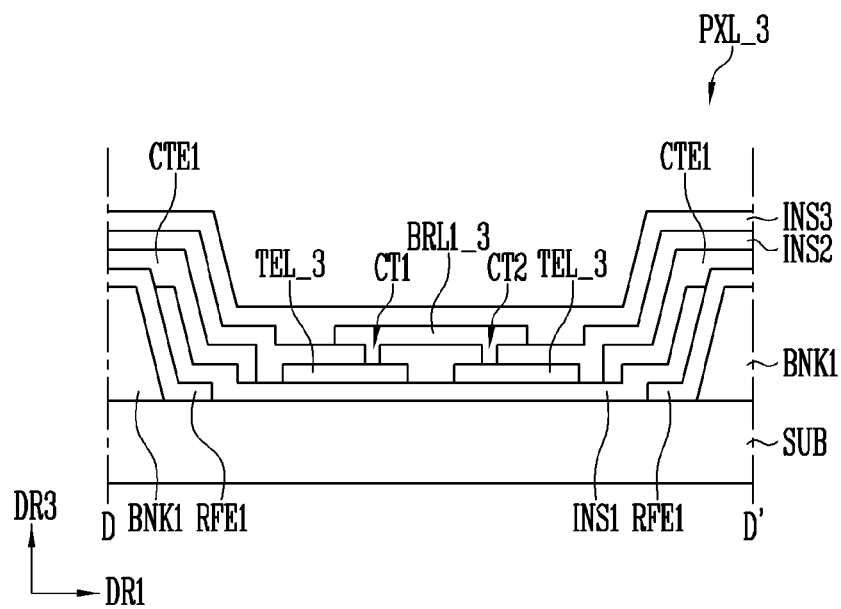
FIGS. 17A and 17B are sectional views of a pixel in accordance with various embodiments, corresponding to line D-D' of FIG. 16.
Figure 17B:
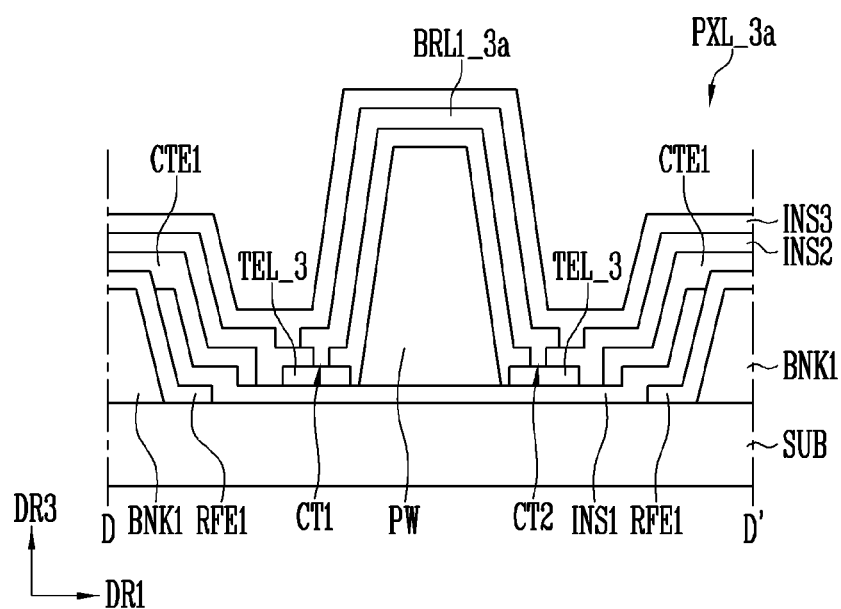

FIG. 16 is a schematic plan view illustrating a display device in accordance with an embodiment. FIGS. 17A and 17B are sectional views of a pixel in accordance with various embodiments, corresponding to line D-D' of FIG. 16.

An embodiment of FIGS. 16 to 17B may be different from an embodiment of FIGS. 10 to 11C in that the electrode pattern TEL_3 may be disposed on a same layer as the third electrode layer CTE1, and the connection patterns BRL1_3 and BRL2_3 may be disposed on a same layer as the fourth electrode layer CTE2.

Referring to FIGS. 16 to 17B, the pixels PXL_3 may include the electrode patterns TEL_3. The electrode patterns TEL_3 may be disposed in the pixel areas PA1, PA2, and PA3, and may be spaced apart from each other in a plan view. The electrode patterns TEL_3 may be disposed on a same layer as the third electrode CTE1.

The connection patterns BRL1_3 and BRL2_3 to connect adjacent electrode patterns TEL_3 may be formed between the electrode patterns TEL_3. The connection patterns BRL1_3 and BRL2_3 may include a first connection pattern BRL1_3 and a second connection pattern BRL2_3. The first connection pattern BRL1_3 may be a connection pattern to connect electrode patterns TEL_3 that are adjacent to each other in the first direction DR1, and the second connection pattern BRL2_3 may be a connection pattern to connect electrode patterns TEL_3 that are adjacent to each other in the second direction DR2.

The first connection pattern BRL1_3 may be disposed on a layer different from the electrode pattern TEL_3. In other words, the first connection pattern BRL1_3 may be disposed on a layer different from the third electrode CTE1. In an embodiment, the first connection pattern BRL1_3 may be disposed on a same layer as the fourth electrode CTE2, and may be disposed between the second insulating layer INS2 and the third insulating layer INS3. The first connection pattern BRL1_3 and the fourth electrode CTE2 may be simultaneously formed and include a same material or a similar material.

The second insulating layer INS2 to cover or overlap the electrode patterns TEL_3 may include a first contactor CT1 and a second contactor CT2 exposing at least a portion of the electrode patterns TEL_3. The electrode patterns TEL_3 adjacent to each other may contact the first connection pattern BRL1_3 through the first contactor CT1 and the second contactor CT2 of the second insulating layer INS2.

As shown in FIG. 17B, the partition wall PW may be further provided on the substrate SUB to enclose each pixel PXL_3a along the boundary of each pixel PXL_3a, and the first connection pattern BRL1_3 may be disposed above the partition wall PW. For example, the first connection pattern BRL1_3a may be disposed between the third insulating layer INS3 and the second insulating layer INS2 disposed on the partition wall PW.

Since the connection relationship and structure of the second connection pattern BRL2_3 may be substantially the same as those of the first connection pattern BRL1_3, a detailed description thereof will be omitted.

Figure 18:
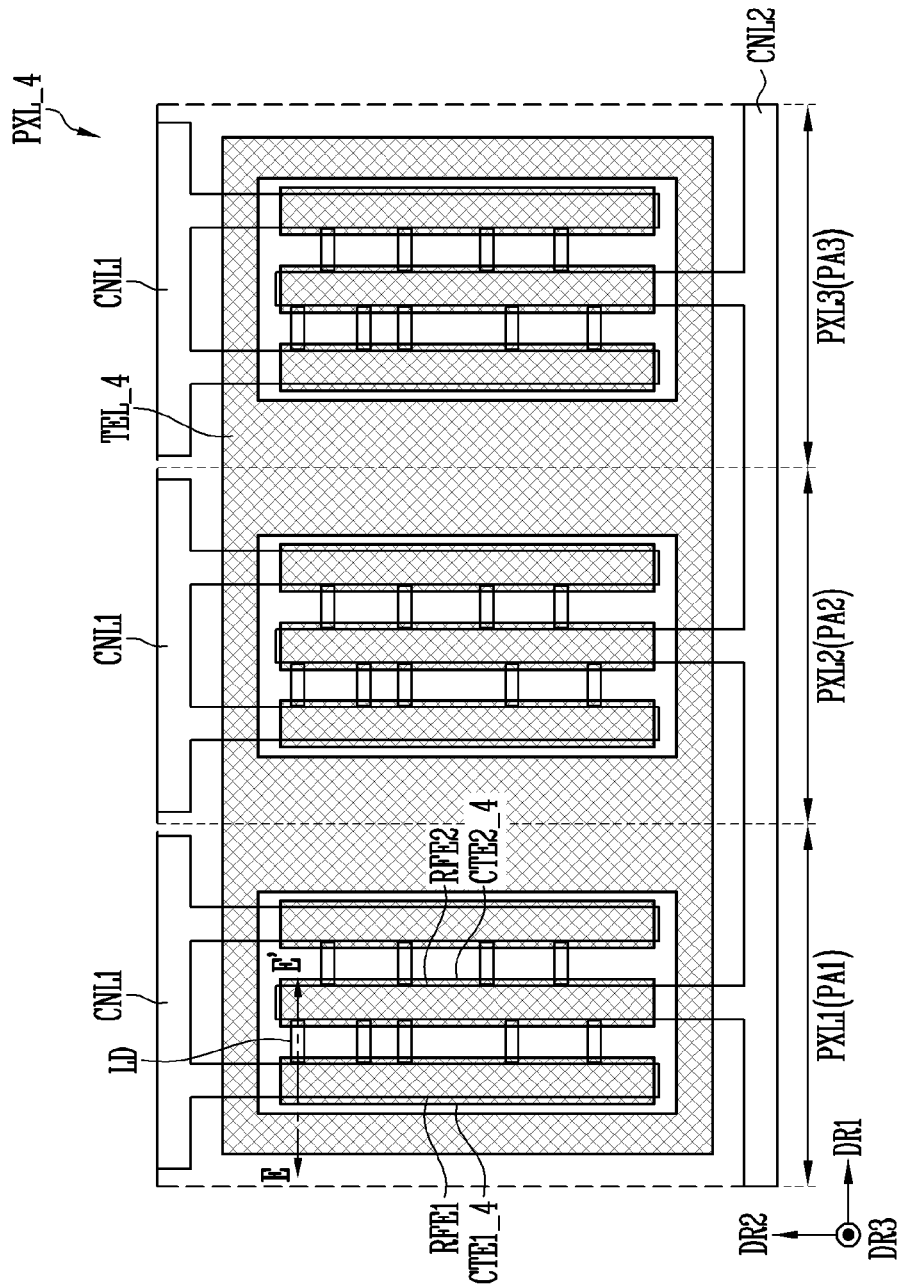
FIG. 18 is a schematic plan view illustrating pixels in accordance with an embodiment.
Figure 19A:
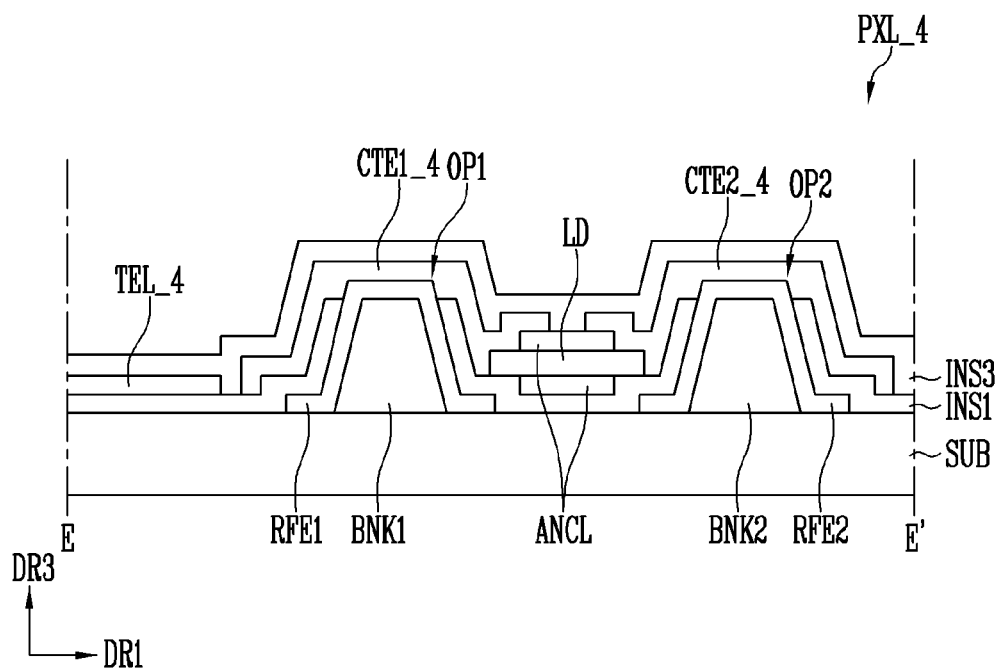
FIGS. 19A and 19B are sectional views of a pixel in accordance with various embodiments, corresponding to line E-E' of FIG. 18.
Figure 19B:
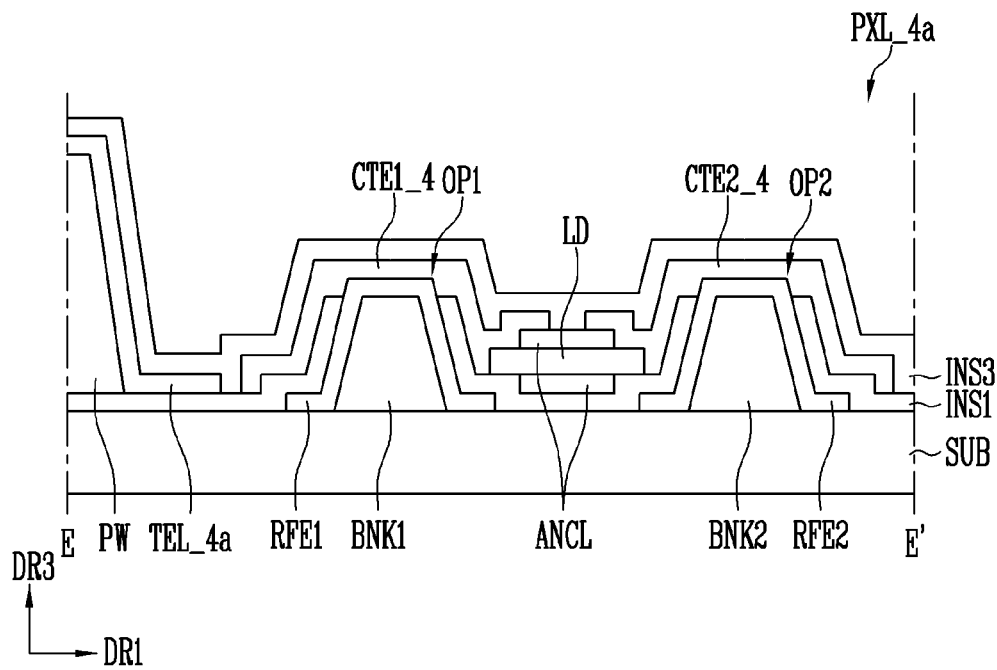

FIG. 18 is a schematic plan view illustrating pixels in accordance with an embodiment. FIGS. 19A and 19B are sectional views of a pixel in accordance with various embodiments, corresponding to line E-E' of FIG. 18.

An embodiment of FIGS. 18 to 19B may be different from the embodiment of FIGS. 5 to 7 in that the third electrode CTE1_4 and the fourth electrode CTE2_4 may be disposed on a same layer, and the electrode pattern TEL_4 may be disposed on a same layer as the third electrode CTE1_4 and the fourth electrode CTE2_4.

Referring to FIGS. 18 to 19B, each pixel PXL_4 may include the electrode pattern TEL_4. The third electrode CTE1_4 and the fourth electrode CTE2_4 may be disposed on a same layer, and the electrode pattern TEL_4 may be disposed on a same layer as the third electrode CTE1_4 and the fourth electrode CTE2_4. In other words, the electrode pattern TEL_4, the third electrode CTE1_4 and the fourth electrode CTE2_4 may be simultaneously formed, and may include a same material or a similar material.

Thus, unlike the above-described embodiments, a separate insulating layer (for example the second insulating layer INS2 of FIG. 7) may not be disposed between the third electrode CTE1_4 and the fourth electrode CTE2_4.

The electrode pattern TEL_4 may be disposed in an area that does not overlap the third electrode CTE1_4 and the fourth electrode CTE2_4 among the pixel areas PA1, PA2, and PA3.

The electrode patterns TEL_4 disposed in the pixel areas PA1, PA2, and PA3 may be integrally connected to each other. However, without being limited thereto, the electrode patterns may be separately formed in the pixel areas PA1, PA2, and PA3.

As shown in FIG. 19B, the partition wall PW may be disposed along the boundary of each pixel PXL_4a, and the electrode pattern TEL_4a may be disposed above the partition wall PW. For example, the electrode pattern TEL_4a may be disposed between the partition wall PW and the third insulating layer INS3.

Figure 21A:
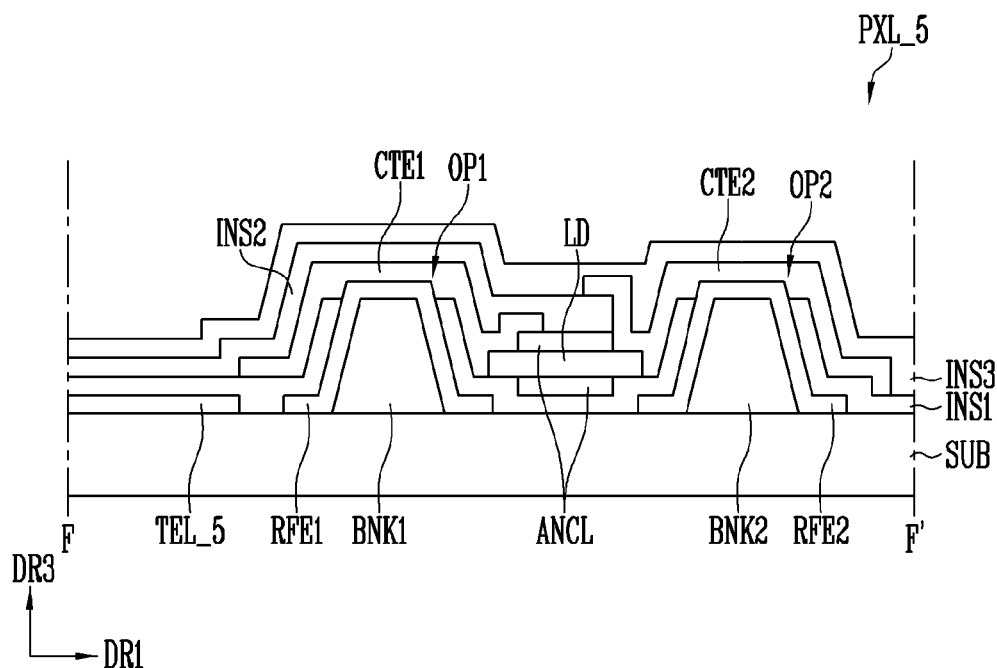
FIGS. 21A and 21B are sectional views of a pixel in accordance with various embodiments, corresponding to line F-F' of FIG. 20.
Figure 21B:
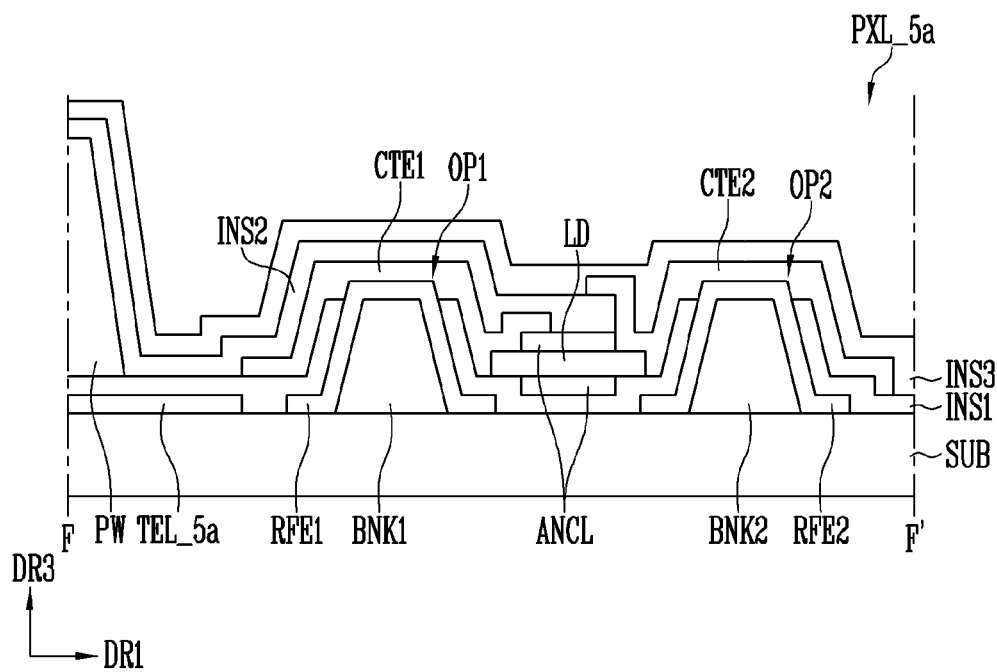
Figure 22:
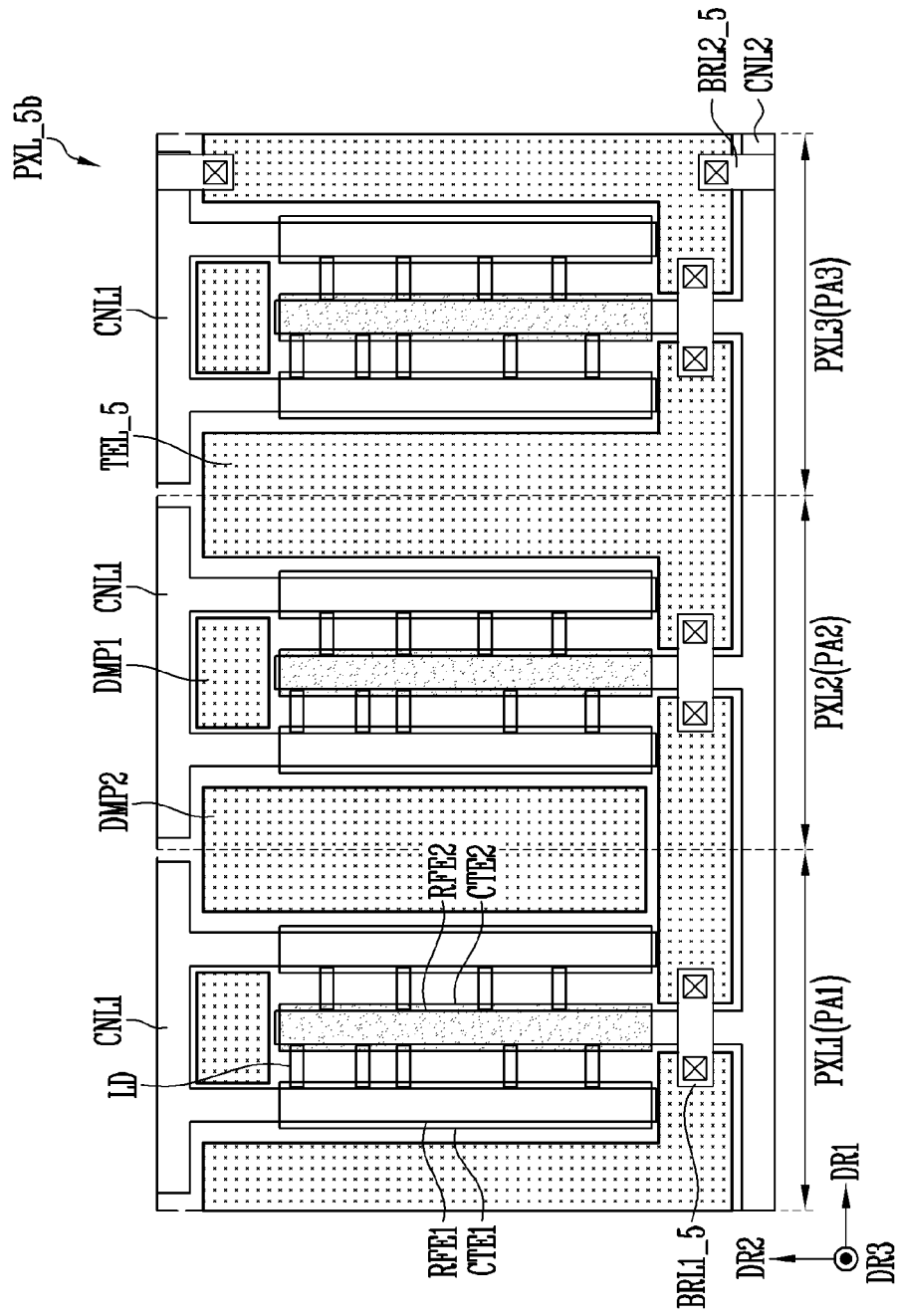
FIG. 22 is a schematic plan view illustrating pixels in accordance with an embodiment.

FIG. 20 is a schematic plan view illustrating pixels in accordance with an embodiment. FIGS. 21A and 21B are sectional views of a pixel in accordance with various embodiments, corresponding to line F-F' of FIG. 20. FIG. 22 is a schematic plan view illustrating pixels in accordance with an embodiment.

An embodiment of FIGS. 20 to 22 may be different from an embodiment of FIGS. 5 to 7 in that the electrode pattern TEL_5 may be disposed on a same layer as the first electrode RFE1 and the second electrode RFE2.

Referring to FIGS. 20 to 22, each pixel PXL_5 may include the electrode pattern TEL_5. The electrode pattern TEL_5 may be disposed on a same layer as the first electrode RFE1 and the second electrode RFE2.

The electrode pattern TEL_5 may be formed simultaneously with the first electrode RFE1 and the second electrode RFE2. For example, a base metal layer may be formed on the substrate SUB, and the base metal layer may be patterned, thus simultaneously forming the first electrode RFE1, the second electrode RFE2 and the electrode pattern TEL_5.

Furthermore, the electrode pattern TEL_5 may include a same material or a similar material as the first electrode RFE1 and the second electrode RFE2. For example, the electrode pattern ILLS may include a conductive material having a reflectivity. Thus, the electrode pattern ILLS may reflect light incident on the electrode pattern ILLS from the outside and emit it to the outside, and may provide a mirror function of reflecting an image of an object positioned in front of the display device.

The electrode pattern TEL_5 may be disposed in an area that does not overlap the first electrode RFE1 and the second electrode RFE2 among the pixel areas PA1, PA2, and PA3.

Furthermore, the electrode pattern TEL_5 may not overlap the third electrode C_TE1 and the fourth electrode CTE2.

The electrode patterns TEL_5 disposed in the pixel areas PA1, PA2, and PA3 may be separately formed in the pixel areas PA1, PA2, and PA3. The connection patterns BRL1_5 and BRL2_5 to connect adjacent electrode patterns TEL_5 may be formed between the electrode patterns TEL_5. The connection patterns BRL1_5 and BRL2_5 may be formed on a same layer as any one of the third electrode CTE1 and the fourth electrode CTE2, but the disclosure is not limited thereto.

As shown in FIG. 21B, the partition wall PW may be disposed along the boundary of each pixel PXL_5a, and the electrode pattern TEL_5a may be disposed under or below the partition wall PW. For example, the electrode pattern TEL_5a may be disposed between the second insulating layer INS2 and the substrate SUB.

Each of the pixels PXL_5 may further include a first dummy pattern DMP1 (or a first dummy electrode) formed in a portion of each of the pixel areas PA1, PA2, and PA3. Furthermore, as shown in FIG. 22, each of the pixels PXL_5b may further include a second dummy pattern DMP2 (or a second dummy electrode) positioned at a boundary of each of the pixels PXL_5b.

The first dummy pattern DMP1 and the second dummy pattern DMP2 may be disposed on a same layer as the electrode pattern TEL_5, and may be formed simultaneously therewith. The first dummy pattern DMP1 and the second dummy pattern DMP2 may be electrically separated or disconnected from the electrode pattern TEL_5. The first dummy pattern DMP1 and the second dummy pattern DMP2 may be electrodes in a floating state, but are not limited thereto. For instance, a voltage or signal different from that of the electrode pattern TEL_5 may be applied to the first dummy pattern DMP1 and the second dummy pattern DMP2. Furthermore, different voltages or signals may be applied to the first dummy pattern DMP1 and the second dummy pattern DMP2, respectively.

The first dummy pattern DMP1 and the second dummy pattern DMP2 may reduce a parasitic capacitance value that may be excessively generated between the electrode pattern TEL_5 and the electrode lines of the pixels PXL_5, and a noise phenomenon of the touch sensor due to parasitic capacitance may be reduced.

Furthermore, the first dummy pattern DMP1 and the second dummy pattern DMP2 may include a conductive material having a reflectivity as in the electrode pattern TEL_5. Thus, the first dummy pattern DAPI and the second dummy pattern DMP2 may provide a mirror function for reflecting an image of an object positioned in front of the display device.

Figure 23:
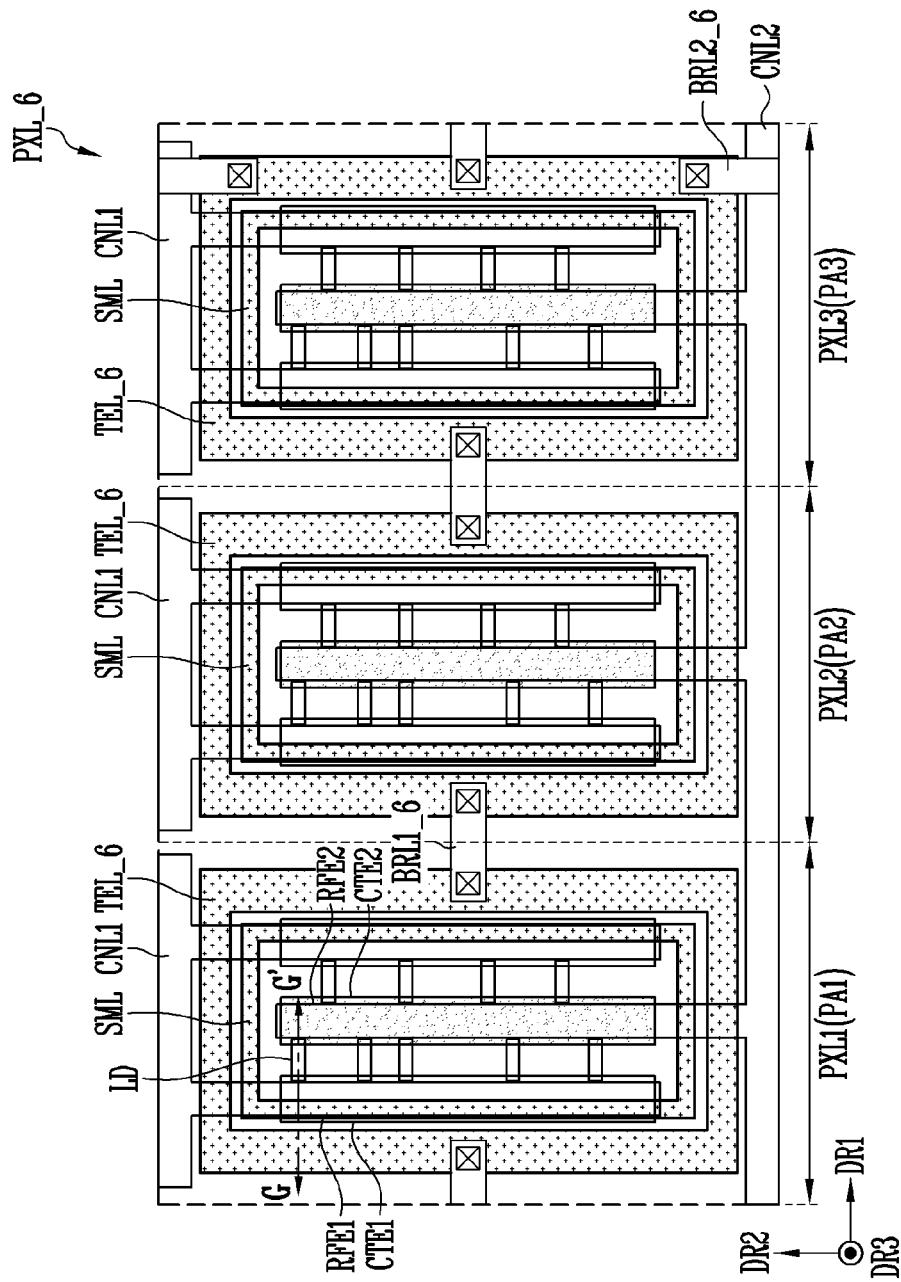
FIG. 23 is a schematic plan view illustrating pixels in accordance with an embodiment.
Figure 24A:
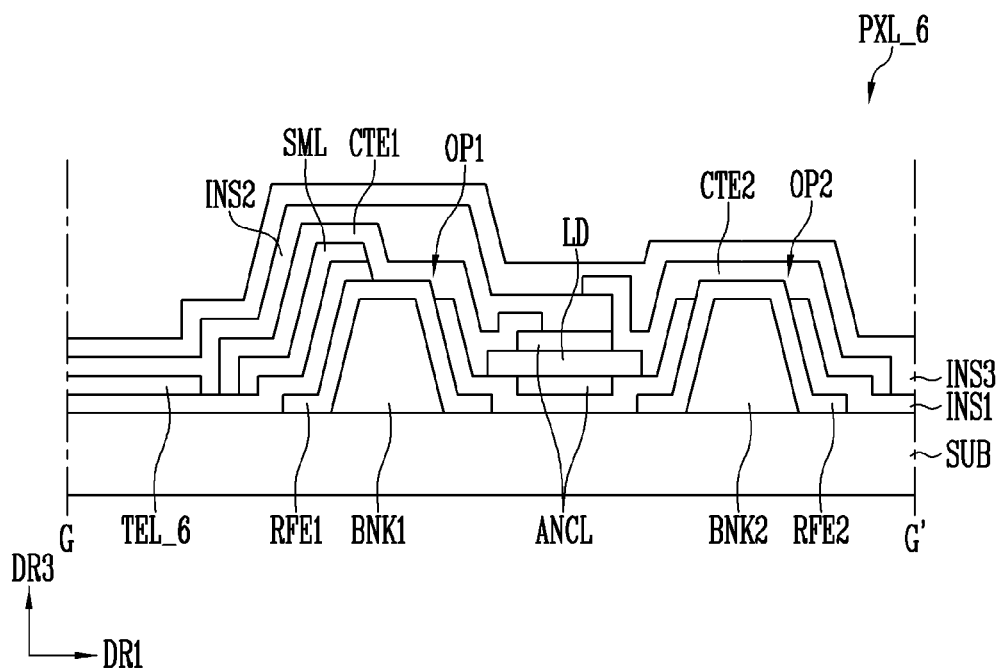
FIGS. 24A and 24B are sectional views of a pixel in accordance with various embodiments, corresponding to line G-G' of FIG. 23.
Figure 24B:
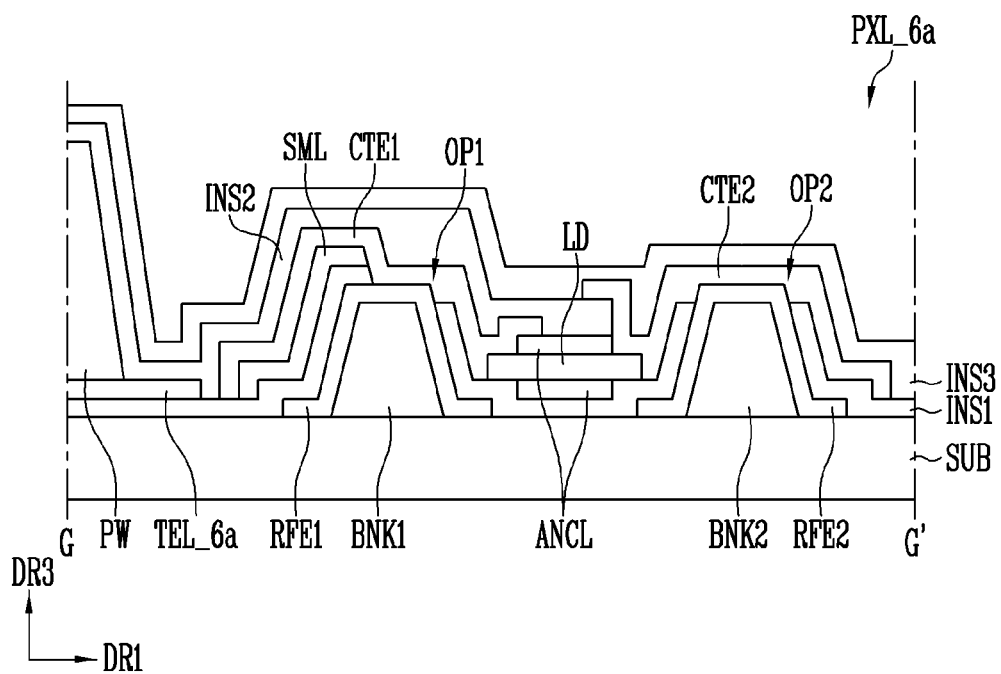

FIG. 23 is a schematic plan view illustrating pixels in accordance with an embodiment. FIGS. 24A and 24B are sectional views of a pixel in accordance with various embodiments, corresponding to line G-G' of FIG. 23.

An embodiment of FIGS. 23 to 24B may be different from an embodiment of FIGS. 5 to 7 in that it further may include a shield electrode SML disposed between the first electrode RFE1 and the third electrode CTE1, and the electrode pattern TEL_6 is disposed on a same layer as the shield electrode SML.

Referring to FIGS. 23 to 24b, each pixel PXL_6 may include the shield electrode SML and the electrode pattern TEL_6. The shield electrode SML may be disposed between the first electrode RFE1 and the third electrode CTE1, and the electrode pattern TEL_6 may be disposed on a same layer as the shield electrode SML. The electrode pattern TEL_6 may be formed simultaneously with the shield electrode SML and may include a same material or a similar material.

For example, a base shield electrode layer may be formed on the first insulating layer INS1 to enclose an area in which each light emitting element LD may be aligned, the light emitting elements LD may be aligned, and the base shield electrode layer may be patterned, thus forming the electrode pattern TEL_6.

The electrode pattern TEL_6 may be disposed in an area that does not overlap the third electrode CTE1 and the fourth electrode CTE2 among the pixel areas PA1, PA2, and PA3, and may be electrically separated or disconnected from the third electrode C_TE1 and the fourth electrode CTE2.

The electrode patterns TEL_6 disposed in the pixel areas PA1, PA2, and PA3 may be separately formed in the pixel areas PA1, PA2, and PA3. The connection patterns BRL1_6 and BRL2_6 to connect adjacent electrode patterns TEL_6 may be formed between the electrode patterns TEL_6. The connection patterns BRL1_6 and BRL2_6 may be formed on a same layer as any one of the third electrode CTE1 and the fourth electrode CTE2, but the disclosure is not limited thereto.

As shown in FIG. 24B, the partition wall PW may be disposed along the boundary of each pixel PXL_6a, and the electrode pattern TEL_6a may be disposed under or below the partition wall PW. For example, the electrode pattern TEL_6a may be disposed between the partition wall PW and the second insulating layer INS2.

Figure 26A:
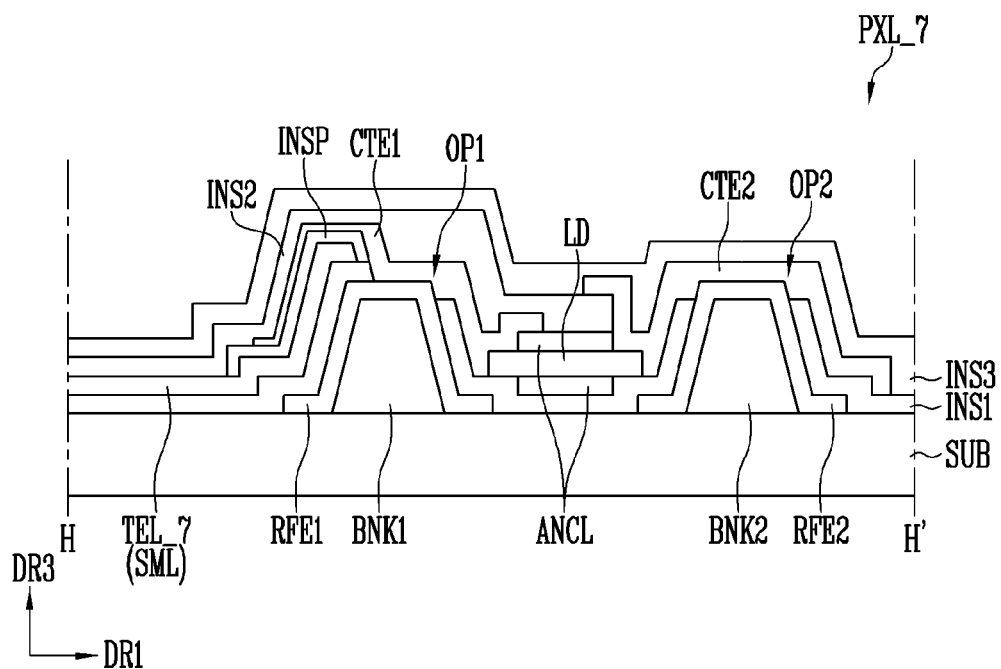
FIGS. 26A and 26B are sectional views of a pixel in accordance with various embodiments, corresponding to line H-H' of FIG. 25.
Figure 26B:
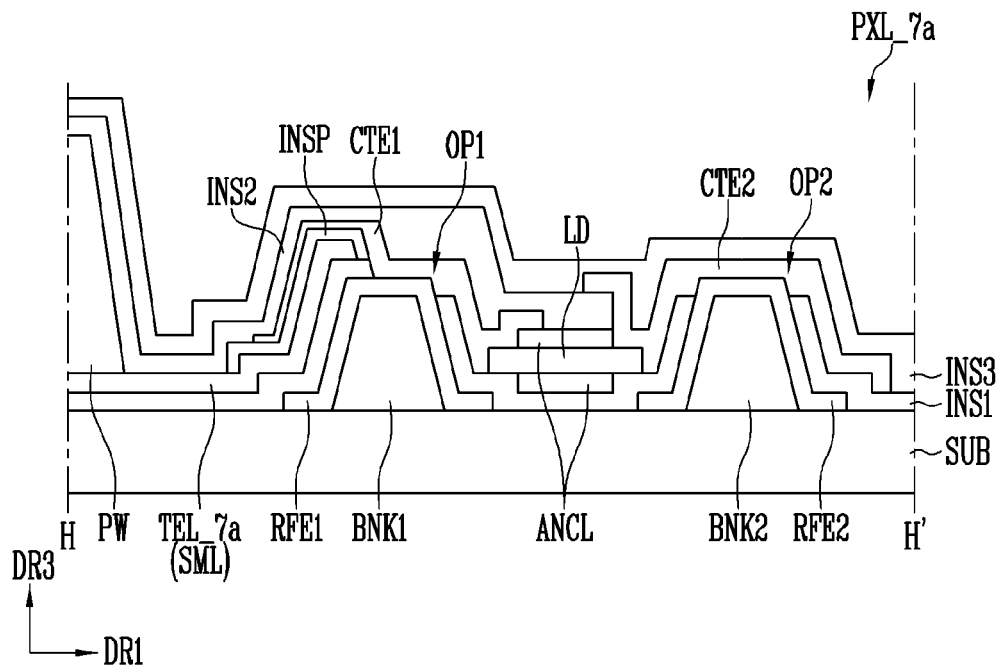

FIG. 25 is a schematic plan view illustrating a display device in accordance with an embodiment. FIGS. 26A and 26B are sectional views of a pixel in accordance with various embodiments, corresponding to line H-H' of FIG. 25.

An embodiment of FIGS. 25 to 26B may be different from an embodiment of FIGS. 23 to 24B in that the shield electrode SML and the electrode pattern TEL_7 may be integral with each other, and an insulating pattern INSP insulating the third electrode CTE1 from the electrode pattern TEL_7 may be further included.

Referring to FIGS. 25 to 26B, each pixel PXL_7 may include the electrode pattern TEL_7 and the insulating pattern INSP.

The electrode pattern TEL_7 may be disposed between the first electrode RFE1 and the third electrode CTE1 and may be formed to enclose an area in which the light emitting elements LD are aligned. In the process of arranging the light emitting elements LD, the electrode pattern TEL_7 may be in a floating state. In other words, the electrode pattern TEL_7 may function as the shield electrode SML, and the light emitting elements LD may be reliably aligned between the first electrode RFE1 and the second electrode RFE2.

The electrode patterns TEL_7 disposed in the pixel areas PA1, PA2, and PA3 may be separately formed in the pixel areas PA1, PA2, and PA3. The connection patterns BRL1_7 and BRL2_7 to connect adjacent electrode patterns TEL_7 may be formed between the electrode patterns TEL_7. The connection patterns BRL1_7 and BRL2_7 may be formed on a same layer as any one of the third electrode CTE1 and the fourth electrode CTE2, but the disclosure is not limited thereto.

Furthermore, the arrangement of the electrode patterns TEL_7 is not limited thereto, and the electrode patterns TEL_7 disposed in the pixel areas PA1, PA2, and PA3 may be integrally connected to each other.

As shown in FIG. 26B, the partition wall PW may be disposed along the boundary of each pixel PXL_7a, and the electrode pattern TEL_7a may be disposed under or below the partition wall PW. For example, the electrode pattern TEL_7a may be disposed between the partition wall PW and the second insulating layer INS2.

Although embodiments have been disclosed, those skilled in the art will appreciate that the disclose can be implemented in other forms, without departing from the scope and spirit of the disclosure. Therefore, it should be understood that the embodiments are only for illustrative purpose and do not limit the scope of the disclosure.

What is claimed is:

1. A display device comprising:
   pixel areas; and
   a pixel disposed in each of the pixel areas,
   wherein the pixel comprises:
     a first electrode and a second electrode disposed on a substrate and disposed on a same layer;
     a light emitting element disposed on the first electrode and the second electrode;
     a third electrode electrically connecting the first electrode to a first end of the light emitting element;
     a fourth electrode electrically connecting the second electrode to a second end of the light emitting element; and
     an electrode pattern, the electrode pattern and one of the third electrode and the fourth electrode being disposed on a same layer.

2. The display device according to claim 1, wherein
   the electrode pattern and the third electrode are disposed on a same layer, and
   the electrode pattern is electrically insulated from the third electrode.

3. The display device according to claim 1, wherein
   the electrode pattern and the fourth electrode are disposed on a same layer,
   the electrode pattern is electrically insulated from the fourth electrode, and
   the electrode pattern overlaps at least a portion of the third electrode in a plan view.

4. The display device according to claim 1, further comprising:
   an input sensing controller electrically connected to the electrode pattern, wherein
   the electrode pattern is an input sensing electrode, and
   the input sensing controller senses an input from an external device based on a signal provided from the electrode pattern.

5. The display device according to claim 4, further comprising:
   a first insulating layer overlapping at least a portion of the first electrode and the second electrode in a plan view, the first insulating layer being disposed between the light emitting element and the substrate, wherein
   the first insulating layer comprises:
     a first opening exposing at least a portion of the first electrode; and
     a second opening exposing at least a portion of the second electrode,
   the third electrode electrically contacts the first electrode through the first opening, and
   the fourth electrode electrically contacts the second electrode through the second opening.

6. The display device according to claim 5, further comprising:

a second insulating layer overlapping the third electrode in a plan view, wherein
the electrode pattern and the fourth electrode are disposed on a same layer, and
the electrode pattern is disposed on the second insulating layer.

7. The display device according to claim 5, further comprising:
a second insulating layer overlapping the third electrode in a plan view, wherein
the electrode pattern and the third electrode are disposed on a same layer, and
the electrode pattern is disposed between the first insulating layer and the second insulating layer.

8. The display device according to claim 5, wherein the electrode pattern comprises a first electrode pattern and a second electrode pattern spaced apart from each other.

9. The display device according to claim 8, further comprising:
a connection pattern electrically connecting the first electrode pattern to the second electrode pattern, wherein
the connection pattern and one of the third electrode and the fourth electrode are disposed on a same layer, and
the connection pattern is disposed on a layer different from the first electrode pattern and the second electrode pattern.

10. The display device according to claim 9, further comprising:
a bank disposed on the substrate along a boundary of the pixel areas,
wherein the connection pattern is disposed on the bank.

11. The display device according to claim 9, further comprising:
a bank disposed on the substrate along a boundary of the pixel areas,
wherein the connection pattern is disposed between the first insulating layer and the bank.

12. The display device according to claim 9, further comprising:
a second insulating layer overlapping the third electrode in a plan view, wherein
the second insulating layer comprises a first contactor and a second contactor that overlap the connection pattern in a plan view, and
the electrode pattern is electrically connected to the connection pattern through the first contactor and the second contactor.

13. The display device according to claim 5, further comprising:
a second insulating layer overlapping the third electrode and the fourth electrode in a plan view, wherein
the third electrode and the fourth electrode are disposed on a same layer, and
the electrode pattern is disposed between the first insulating layer and the second insulating layer.

14. The display device according to claim 13, further comprising:
a bank disposed on the substrate along a boundary of the pixel areas, and
wherein the electrode pattern is disposed between the bank and the second insulating layer.

15. The display device according to claim 4, wherein the electrode pattern is disposed in a window shape in a plan view.

16. A display device comprising:
pixel areas;
a pixel disposed in each of the pixel areas; and
an input sensing controller, wherein
the pixel comprises:
a first electrode and a second electrode disposed on a substrate, and disposed on a same layer;
a light emitting elements electrically connected to the first electrode and the second electrode; and
a sensing electrode, the sensing electrode, the first electrode, and the second electrode being disposed on a same layer, and
the input sensing controller is electrically connected to the sensing electrode to sense an input from an external device based on a signal provided from the sensing electrode.

17. The display device according to claim 16, further comprising:
a first insulating layer overlapping at least a portion of the first electrode and the second electrode in a plan view and disposed between the light emitting element and the substrate;
a third electrode disposed on the first electrode and electrically contacting a first end of the light emitting element; and
a fourth electrode disposed on the second electrode and electrically contacting a second end of the light emitting element, wherein
the first insulating layer comprises:
a first opening exposing at least a portion of the first electrode; and
a second opening exposing at least a portion of the second electrode,
the third electrode electrically contacts the first electrode through the first opening, and
the fourth electrode electrically contacts the second electrode through the second opening.

18. The display device according to claim 16, wherein
the sensing electrode comprises a metal having a reflectivity, and
the sensing electrode reflects light incident from an outside and emits the light to the outside.

19. The display device according to claim 16, further comprising:
a dummy electrode, wherein
the dummy electrode, the first electrode, and the second electrode are disposed on a same layer,
the dummy electrode is electrically disconnected from the sensing electrode.

20. A display device comprising:
pixel areas;
a pixel disposed in each of the pixel areas; and
an input sensing controller, wherein
the pixel comprises:
a first electrode and a second electrode disposed on a substrate and disposed on a same layer;
a light emitting element disposed on the first electrode and the second electrode;
a third electrode electrically connecting the first electrode to a first end of the light emitting element;
a fourth electrode electrically connecting the second electrode to a second end of the light emitting element;
a shield electrode disposed between the first electrode and the third electrode; and
a sensing electrode, the sensing electrode and the shield electrode being disposed on a same layer, and the input sensing controller is electrically connected to the sensing electrode to sense an input from an external device based on a signal provided from the sensing electrode.

21. The display device according to claim 20, wherein the shield electrode and the sensing electrode are spaced apart from each other, and are electrically disconnected from each other.

22. The display device according to claim 20, further comprising:
  an insulating pattern disposed between the shield electrode and the third electrode, wherein
  the shield electrode is electrically disconnected from the third electrode by the insulating pattern, and
  the shield electrode is integral with the sensing electrode.

* * * * *